US012700438B2

(12) United States Patent
Carissimi et al.

(10) Patent No.: US 12,700,438 B2
(45) Date of Patent: Aug. 4, 2026

(54) IN-MEMORY COMPUTATION DEVICE FOR IMPLEMENTING AT LEAST A MULTILAYER NEURAL NETWORK

(71) Applicant: STMicroelectronics International N.V., Geneva (CH)

(72) Inventors: Marcella Carissimi, Treviolo (IT); Marco Pasotti, Travaco' Siccomario (IT); Riccardo Zurla, Binasco (IT)

(73) Assignee: STMicroelectronics International N.V., Geneva (CH)

( * ) Notice: Subject to any disclaimer, the term of this patent is extended or adjusted under 35 U.S.C. 154(b) by 52 days.

(21) Appl. No.: 18/675,916

(22) Filed: May 28, 2024

(65) Prior Publication Data

US 2024/0404569 A1    Dec. 5, 2024

(30) Foreign Application Priority Data

May 30, 2023    (IT) ........................ 102023000010893

(51) Int. Cl.
*G11C 7/16*          (2006.01)
*G06F 7/544*         (2006.01)
(Continued)

(52) U.S. Cl.
CPC .............. *G11C 7/16* (2013.01); *G06F 7/5443* (2013.01); *G11C 11/54* (2013.01);
(Continued)

(58) Field of Classification Search
CPC ....... G11C 7/16; G11C 11/54; G11C 13/0004; G11C 13/0028; G11C 2213/79; G06F 7/5443
See application file for complete search history.

(56) References Cited

U.S. PATENT DOCUMENTS 8,699,273 B2    4/2014  Binboga
8,902,678 B2   12/2014  Dimartino et al.
(Continued)

FOREIGN PATENT DOCUMENTS

CN        110197253 A     9/2019
CN        115210810 A    10/2022
(Continued)

OTHER PUBLICATIONS

IT Search Report and Written Opinion for priority application, IT Appl. No. 102023000010893, report dated Nov. 20, 2023, 7 pgs.
(Continued)

*Primary Examiner* — Vanthu T Nguyen
(74) *Attorney, Agent, or Firm* — Crowe & Dunlevy LLC

(57)    ABSTRACT

An in-memory computation (IMC) device is configured to receive input data and provide intermediate output data. A word line activation circuit receives input data and provides corresponding word line activation signals. A memory array includes memory cells in a matrix arrangement coupled to bit lines and to word lines. Each bit line is traversed by a respective bit line current depending on the memory cells connected to the bit line. Selectors each coupled to a respective part of the bit lines are configured to select one of the respective bit lines. A digital detector for each selector is electrically connected, through the respective selector, with the respective bit line selected. The digital detectors sample the respective bit line currents and, in response to the bit line currents, provide the respective intermediate output data.

28 Claims, 15 Drawing Sheets

Figure 1:
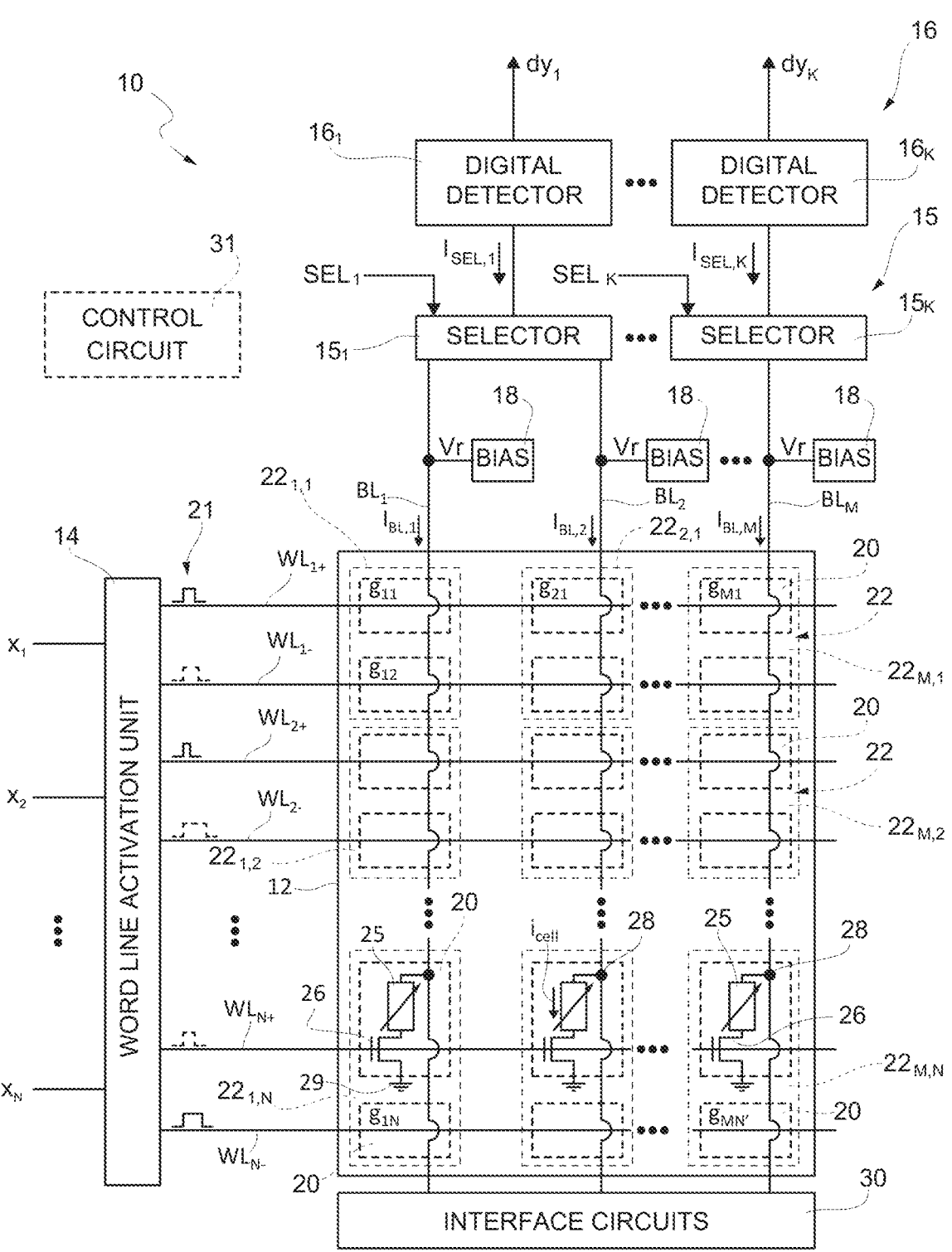

(51) Int. Cl.
  *G11C 11/54*    (2006.01)
  *G11C 13/00*    (2006.01)
(52) U.S. Cl.
  CPC ...... *G11C 13/0004* (2013.01); *G11C 13/0028*
    (2013.01); *G11C 2213/79* (2013.01)

(56) References Cited

U.S. PATENT DOCUMENTS

| | | | |
|---|---|---|---|
| 8,953,360 | B2 | 2/2015 | Bedeschi |
| 9,396,795 | B1 | 7/2016 | Jeloka et al. |
| 9,508,446 | B1 | 11/2016 | Chen et al. |
| 9,859,008 | B1 | 1/2018 | Kim |
| 9,887,011 | B1 | 2/2018 | Hung |
| 10,056,145 | B2 | 8/2018 | Backhausen et al. |
| 10,073,733 | B1 | 9/2018 | Jain et al. |
| 10,319,449 | B1 | 6/2019 | Yang |
| 10,373,682 | B2 | 8/2019 | Parkinson et al. |
| 10,528,643 | B1 * | 1/2020 | Choi ........................ G06F 17/16 |
| 10,636,481 | B1 | 4/2020 | Chang et al. |
| 10,643,677 | B2 | 5/2020 | Yabe |
| 10,692,570 | B2 | 6/2020 | Al-Shamma |
| 10,762,958 | B2 | 9/2020 | Pyo et al. |
| 10,831,446 | B2 | 11/2020 | Chen et al. |
| 10,943,652 | B2 | 3/2021 | Lu et al. |
| 11,024,393 | B1 | 6/2021 | Zhang et al. |
| 11,043,259 | B2 | 6/2021 | Wentzlaff et al. |
| 11,061,646 | B2 | 7/2021 | Sumbul et al. |
| 11,100,987 | B1 | 8/2021 | Mantegazza et al. |
| 11,176,993 | B2 | 11/2021 | Kim et al. |
| 11,756,615 | B2 * | 9/2023 | Carissimi ................. G11C 7/12 |
| | | | 365/163 |
| 11,886,972 | B2 * | 1/2024 | Garcia Redondo ... G06F 7/5443 |
| 2017/0263306 | A1 | 9/2017 | Murphy |
| 2018/0260696 | A1 | 9/2018 | Suda et al. |
| 2019/0042199 | A1 | 2/2019 | Sumbul et al. |
| 2019/0279709 | A1 | 9/2019 | Lee |
| 2020/0174786 | A1 | 6/2020 | Zhang et al. |
| 2020/0233923 | A1 | 7/2020 | Knag et al. |
| 2020/0310758 | A1 | 10/2020 | Desoli et al. |
| 2020/0310761 | A1 | 10/2020 | Rossi et al. |
| 2021/0033648 | A1 | 2/2021 | Khaddam-Aljamen et al. |
| 2021/0035636 | A1 | 2/2021 | Nazarian |
| 2021/0134343 | A1 | 5/2021 | Li et al. |
| 2021/0271597 | A1 | 9/2021 | Verma et al. |
| 2021/0279036 | A1 | 9/2021 | Li et al. |
| 2021/0334639 | A1 | 10/2021 | Tran |
| 2021/0342671 | A1 | 11/2021 | Hoang et al. |
| 2021/0343320 | A1 | 11/2021 | Horng et al. |
| 2021/0349689 | A1 | 11/2021 | Lu et al. |
| 2022/0004852 | A1 | 1/2022 | Ju et al. |
| 2022/0012586 | A1 | 1/2022 | Lin et al. |
| 2022/0028445 | A1 | 1/2022 | Park et al. |
| 2022/0043885 | A1 | 2/2022 | La Rosa et al. |
| 2022/0044099 | A1 | 2/2022 | Conte et al. |
| 2022/0068380 | A1 | 3/2022 | Carissimi et al. |
| 2022/0238151 | A1 | 7/2022 | Lin et al. |
| 2022/0244916 | A1 | 8/2022 | Lee et al. |
| 2022/0246212 | A1 | 8/2022 | Lue et al. |
| 2023/0238055 | A1 | 7/2023 | Pasotti et al. |
| 2024/0055033 | A1 | 2/2024 | Hsu et al. |
| 2024/0112004 | A1 | 4/2024 | An et al. |
| 2024/0176586 | A1 | 5/2024 | Carissimi et al. |
| 2024/0212730 | A1 | 6/2024 | Carissimi et al. |
| 2024/0212751 | A1 | 6/2024 | Zurla et al. |
| 2024/0404594 | A1 | 12/2024 | Carissimi et al. |
| 2025/0080118 | A1 | 3/2025 | Pasotti et al. |

FOREIGN PATENT DOCUMENTS

| | | |
|---|---|---|
| CN | 115312095 A | 11/2022 |
| TW | 202013213 A | 4/2020 |
| WO | 2021137894 A1 | 7/2021 |
| WO | 2021158861 A1 | 8/2021 |

OTHER PUBLICATIONS

Biswas, et al.: "CONV-SRAM: An Energy-Efficient SRAM With In-Memory Dot-Product Computation for Low-Power Convolutional Neural Networks," IEEE Journal of Solid-State Circuits 54, No. 1, Dec. 17, 2018, pp. 217-230.

Chi, et al: "Prime: A Novel Processing-In-Memory Architecture for Neural Network Computation in ReRAM-Based Main Memory," ACM SIGARCH Computer Architecture News 44, No. 3, Jun. 18, 2016, pp. 27-39.

Khaddam-Aljameh R et al: "Hermes Core—A 14NM CMOS and PCM-Based in Memory Compute Core Using an Array of 300PS/ LSB Linearized CCO-Based ADCS and Local Digital Processing", 2021 Symposium on VLSI Circuits Digest of Technocal Papers, 3 pgs.

Lelmini, Daniele et al: "Device and Circuit Architectures for In-Memory Computing," Advanced Intelligent Systems, Sep. 2020, 19 pages.

Mayahinia Mahta et al: "A Voltage-Controlled, Oscillation-Based ADC Design for Computation-in-Memory Architectures Using Emerging ReRAMs," ACM Journal on Emerging Technologies in Computing Systems, vol. 18, No. 2, Article 32, Pub date Mar. 2022, 26 pgs.

Mittal, Sparsh: "A Survey of ReRAM-Based Architectures for Processing-In-Memory and Neural Networks," Machine Learning and Knowledge Extractions 1, No. 1, Mar. 2019, pp. 75-114.

Xie, Chenchen, et al: "Speeding Up the Write Operation for Multi-Level Cell Phase Change Memory with Programmable Ramp-Down Current Pules," Micromachines 2019, www.mdpi.com/journal/ micromachines, 13 pages.

Zhang Xueyong et al: "A 0.11-0.38 pJ/cycle Differential Ring Oscillator in 65 nm CMOS for Robust Neurocomputing," IEEE Transactions on Circuits and Systems—I: Regular Papers, vol. 68, No. 2, Feb. 2021, 15 pgs.

* cited by examiner

IN-MEMORY COMPUTATION DEVICE FOR IMPLEMENTING AT LEAST A MULTILAYER NEURAL NETWORK

PRIORITY CLAIM

This application claims the priority benefit of Italian Application for Patent No. 102023000010893 filed on May 30, 2023, the content of which is hereby incorporated by reference in its entirety to the maximum extent allowable by law.

TECHNICAL FIELD

The present invention relates to an in-memory computation (IMC) device for implementing at least a multilayer neural network and, furthermore, relates to a control method of the IMC device and a corresponding computer program product.

BACKGROUND

As is known, an in-memory computation device uses the specific arrangement of the memory cells of a memory array to perform analog data processing at cell level.

For example, in-memory computation devices are used to perform multiply and accumulate (MAC) operations, which are employed, for example, to implement machine learning algorithms, such as for example neural networks.

A multiply and accumulate operation provides an output vector $y_1, \ldots, y_M$ as a multiplication of an input vector $x_1, \ldots, X_N$ by a vector or matrix of computational weights $g_{ij}$, for example:

$$\begin{bmatrix} y_1 \\ y_2 \\ \vdots \\ y_m \end{bmatrix} = \begin{bmatrix} g_{11} & g_{12} & \cdots & g_{1n} \\ g_{21} & g_{22} & \cdots & g_{2n} \\ \vdots & \vdots & \vdots & \vdots \\ g_{m1} & g_{m2} & \cdots & g_{mn} \end{bmatrix} \times \begin{bmatrix} x_1 \\ x_2 \\ \vdots \\ x_n \end{bmatrix}, \text{ i.e.:}$$

$$\begin{cases} y_1 = g_{11} \cdot x_1 + g_{12} \cdot x_2 + \ldots + g_{1N} \cdot x_N \\ y_2 = g_{21} \cdot x_1 + g_{22} \cdot x_2 + \ldots + g_{2N} \cdot x_N \\ \qquad\qquad\qquad \vdots \\ y_M = g_{M1} \cdot x_1 + g_{M2} \cdot x_2 + \ldots + g_{MN} \cdot x_N \end{cases}$$

The in-memory computation device stores the computational weights $g_{ij}$ in the memory cells and performs the multiplication and sum operations at cell level.

In detail, for each output vector $y_i$, known in-memory devices generate a current indicative of $$\sum_{i=1}^{i=M} g_{ij} \cdot x_j$$

and comprise a reading circuit having a respective analog-to-digital converter (ADC) which discretizes said current.

In-memory computation devices allow the back and forth transfer of data between a memory and a processing circuit to be avoided. Consequently, the performance of an in-memory computation device is not limited by the data transfer bandwidth between memory and processing circuit and has low power consumption.

However, it has been verified that the ADCs of known in-memory computation devices have a large chip area occupation and a slow conversion time, thereby causing high manufacturing costs and low performance of the corresponding in-memory computation devices, especially when large amounts of calculation and therefore a corresponding high number of ADCs are required by the in-memory computation device.

This issue especially prevents nowadays the manufacture, at low cost and with reduced area occupation, of in-memory computation devices suitable for implementing a neural network (NN) comprising a plurality of layers.

There is a need in the art to overcome the drawbacks of the prior art.

SUMMARY

Embodiments herein relate to an IMC device, a control method of the IMC device and a corresponding computer program product.

In an embodiment, an in-memory computation (IMC) device is configured to receive an input signal comprising a plurality of input data and to provide at least a plurality of intermediate output data indicative of a respective final output signal which is a function of the input signal, the IMC device comprising: a word line activation circuit configured to receive the input signal and to provide a plurality of word line activation signals, each being a function of a respective input datum of the plurality of input data; a biasing circuit configured to provide a biasing voltage; a memory array comprising a plurality of memory cells having a matrix arrangement with a number M of columns and a number N' of rows and each coupled to a respective bit line and to a respective word line in such a way that each of the M bit lines is electrically coupled to N' respective memory cells and each of the N' word lines is electrically coupled to M respective memory cells, the bit lines being configured to each receive the biasing voltage, the memory cells being configured to each store a respective computational weight and to each receive a respective word line activation signal of the word line activation signals from the respective word line, the memory cells being configured to be traversed each by a respective cell current which is a function of the biasing voltage, of the respective word line activation signal and of the respective computational weight, each bit line being configured to be traversed by a respective bit line current which is a sum of the cell currents of the memory cells connected to the bit line; a plurality K of selectors each coupled to a respective part of the bit lines and each configured to select one, or none, of the respective bit lines; and a digital detector for each selector, each digital detector being coupled to the respective selector in such a way as to be in electrical connection, through the respective selector, with the respective bit line selected by the respective selector, the digital detectors being configured to sample the respective bit line currents traversing the respective bit lines to which the digital detectors are electrically coupled and, in response to the sampled bit line currents, provide the respective intermediate output data.

In an embodiment, a method for controlling the in-memory computation device as described above comprises the steps of: generating the biasing voltage and applying the biasing voltage to the bit lines; providing, by the word line activation circuit, the plurality of activation signals to the memory cells, each activation signal being a function of a respective input value; selecting, by the selectors, one or none of the respective bit lines; and sampling, by the digital detectors, the respective bit line currents traversing the respective bit lines to which the digital detectors are electrically coupled and, in response to the sampled bit line currents (, providing the respective intermediate output data.

BRIEF DESCRIPTION OF THE DRAWINGS

For a better understanding of the present invention, a preferred embodiment is now described, purely by way of non-limiting example, with reference to the attached drawings, wherein:

FIG. 1 shows a block diagram of the present in-memory computation device, according to an embodiment;

FIG. 2 shows a circuit diagram of a line activation circuit of the in-memory computation device of FIG. 1;

FIG. 3 shows a detailed circuit diagram of a timer of the line activation circuit of FIG. 2, according to an embodiment;

FIG. 4 shows a detailed circuit diagram of a portion of the timer of FIG. 3;

FIGS. 5A-5C show detailed circuit diagrams of respective input-to-time converters of the line activation circuit of FIG. 2, according to an embodiment;

FIGS. 6A and 6B show detailed circuit diagrams of respective portions of the input-to-time converters of FIGS. 5A-5C;

FIG. 7A shows an example of activation signals provided by the input-to-time converters of FIGS. 5A-5C;

FIG. 7B shows an example of electrical signals generated by the in-memory computation device of FIG. 1;

FIG. 8 shows a detailed circuit diagram of a digital detector of the line activation circuit of FIG. 2, according to an embodiment;

FIG. 9 shows a detailed circuit diagram of a portion of the digital detector of FIG. 8;

FIG. 10 shows an example of electrical signals generated by the digital detector of FIG. 8;

FIGS. 11, 13 and 14 schematically show respective embodiments of the in-memory computation device of FIG. 1;

FIG. 12 shows a detailed circuit diagram of a multiply and accumulate assembly of the in-memory computation device of FIGS. 11, 13 and 14, according to an embodiment;

FIG. 15 shows a detailed circuit diagram of a multiply and accumulate assembly of the in-memory computation device of FIGS. 11, 13 and 14, according to a different embodiment; and FIG. 16 shows a detailed circuit diagram of an input-to-time converter of the in-memory computation device, according to the embodiment of FIG. 15.

DETAILED DESCRIPTION

In the following description, elements common to the different embodiments have been indicated with the same reference numerals.

FIG. 1 shows an in-memory computation device 10, hereinafter also referred to as IMC device 10, comprising a computation memory array (or matrix) (hereinafter referred to as memory array) 12, a word line activation circuit 14, a plurality of selectors 15, a plurality of digital detectors 16 and a biasing circuit 18.

The memory array 12 is configured for multiply and accumulate (MAC) operations starting from an input vector (or signal) X with input data $x_1, \ldots, X_N$ (in general, identified by the index n=1, . . . , N), in order to generate intermediate output data $dy_k$ (with k=1, . . . , K) useful for calculating a final output vector (or signal) Y.

The memory array 12 is of non-volatile type and comprises a plurality of memory cells 20 organized according to a matrix arrangement having M columns and N' rows.

The memory cells 20 arranged in the same column are mutually connected through a respective bit line $BL_i$, wherein i=1, . . . , M. The bit lines will also be indicated hereinafter with the reference $BL_m$, wherein m=i=1, . . . , M.

The memory cells 20 arranged in the same row are mutually connected through a respective word line $WL_j$, wherein j=1, . . . , N' and wherein N' is an even number. Two word lines $WL_j$ and $WL_{j+1}$ consecutive to each other form a respective sign word line group $WL_{n+,-}$(with n=1, . . . , N where N=N'/2), in such a way that each word line $WL_j$ is part of a single sign word line group $WL_{n+,-}$.

In practice, a respective word line $WL_j$ and a respective bit line $BL_i$ are associated with each memory cell 20.

Along each bit line $BL_i$, the memory cells 20 are grouped operatively to form memory groups 22, as better described below. In this manner the sign of the input datum $x_n$ (with n=1 . . . , N) may also be processed, as better described below.

The memory cells 20 are programmed to store each a respective computational weight $g_{ij}$ which may be used as a weight to perform an in-memory calculation such as a multiply and accumulate (MAC) operation.

The word line activation circuit 14 provides a plurality of word line activation signals 21, one for each word line $WL_j$, which are configured to activate each the memory cells 20 of a respective word line $WL_j$, as discussed in detail hereinafter.

The word line activation circuit 14 receives the input vector X including the plurality of input values $x_1, \ldots, X_N$, one for each sign word line group $WL_{n+,-}$.

The word line activation signals 21 are pulses, in particular here rectangular pulses, each having a time duration (i.e., width) which is a function of the respective input value $x_n$.

The biasing circuit 18 generates a biasing voltage Vr in a per se known manner and provides the biasing voltage Vr to the bit lines $BL_1, \ldots, BL_M$, as discussed in detail hereinafter. In particular, and as shown in FIG. 1, the biasing circuit 18 is electrically coupled to the bit lines $BL_1, \ldots, BL_M$, for example between the memory cells 20 and the selectors 15.

In this embodiment, the biasing circuit 18 provides the same voltage Vr to all the bit lines $BL_1, \ldots, BL_M$. However, the biasing circuit 18 may provide the bit lines $BL_1, \ldots, BL_M$, starting from the biasing voltage Vr, with biasing voltages different from each other, according to the specific application.

The selectors 15 are each coupled to a respective part of the bit lines $BL_i$, in a manner better described below, so as to be interposed between these bit lines $BL_i$ and a respective digital detector 16. In detail, each selector $\mathbf{15}_k$ (with k=1, . . . , K, where K is the number of selectors 15 and digital detectors 16) receives a respective selection signal $SEL_k$ and, on the basis of the latter, electrically connects the respective digital detector $\mathbf{16}_k$ with one of these bit lines $BL_i$, selected owing to the selection signal $SEL_k$.

The digital detectors 16 are analog-to-digital converters (ADC) which are each coupled to a respective selector 15. Through the respective selector $\mathbf{15}_k$ and on the basis of the selection signal $SEL_k$, each digital detector 16 is selectively placed in electrical connection with one of the bit lines $BL_i$ whereto the selector $\mathbf{15}_k$ is connected. The digital detectors 16 each provide a respective intermediate output datum $dy_k$ by sampling a respective current $I_{SEL,k}$ which, through the respective selector $\mathbf{15}_k$, flows in the respective bit line $BL_i$ selected (i.e., by sampling the currents $I_{BL}$ flowing through the respective bit lines BL whereto the digital detectors 16 are connected through the respective selectors 15).

Figure 11:
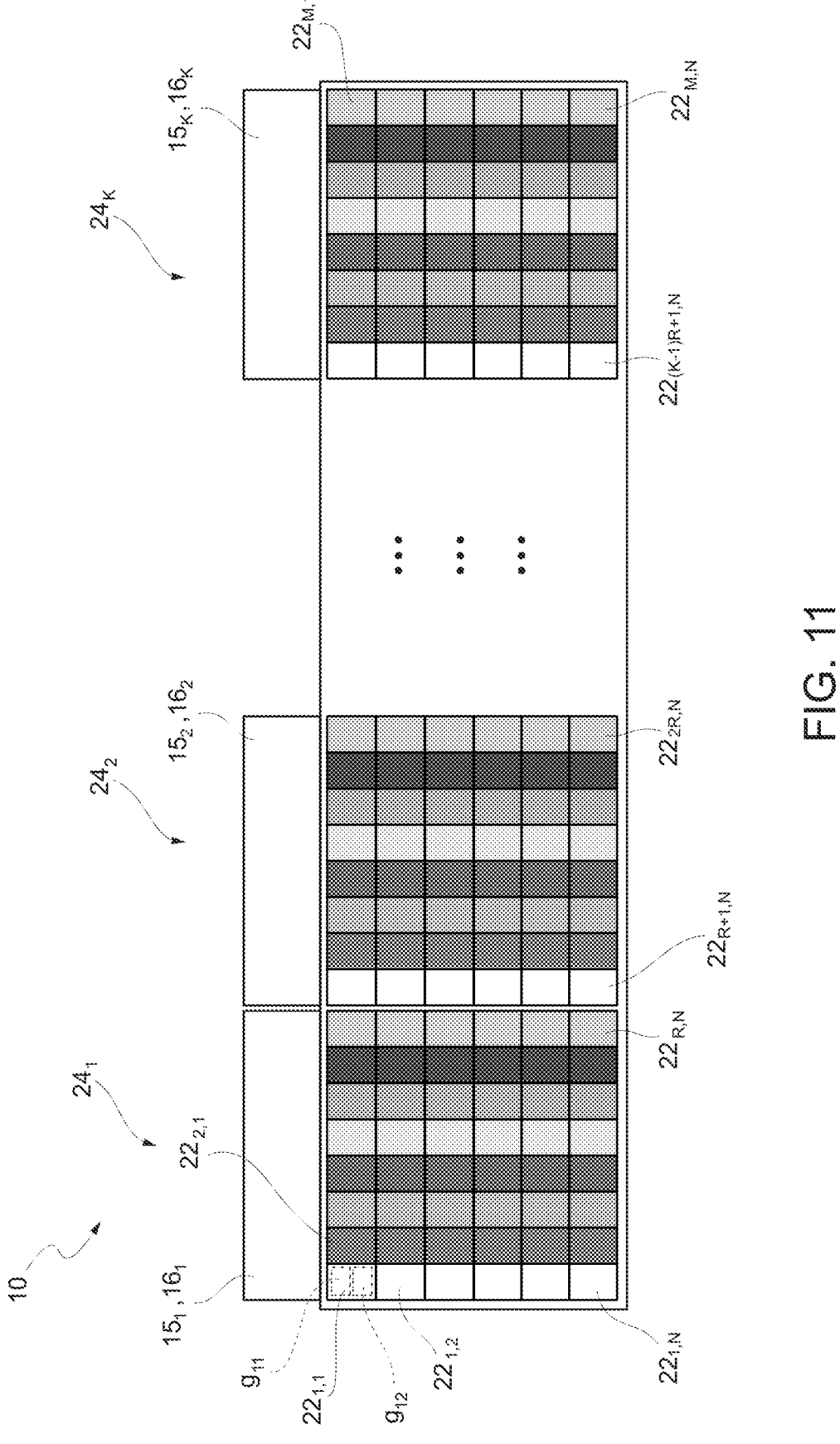

In general, each digital detector 16$_k$, the respective selector 15$_k$ and the plurality of memory cells 20 of the bit lines BL$_i$ electrically connected to the respective selector 15$_k$ form, together, a respective multiply and accumulate assembly (MAC assembly, for example shown in FIG. 11 and indicated with the reference 24$_k$). As better discussed below, the different MAC assemblies 24 are arranged laterally to each other along the word lines WL$_j$, therefore they share the word lines WL$_j$ while having bit lines BL$_i$ which are independent of each other.

The memory cells 20 each comprise a storage element 25 and a selection element 26.

The storage element 25 of each memory cell 20 is a variable resistive element, in particular here based on a Phase Change Material (PCM), such as for example a chalcogenide.

In detail, the computational weight $g_{ij}$ indicates the transconductance value of the storage element 25 of the respective memory cell 20, i.e., it is indicative of the programmed resistance of the storage element 25.

A phase change material has at least two phase states, for example an amorphous phase and a crystalline phase, each having a respective resistivity.

A phase change material may be transformed from one phase state to another by means of heat transfer, for example using current pulses.

The resistance of each storage element 25 associated with the respective phase state is used to distinguish two or more logic states of the corresponding memory cell 20.

For example, the amorphous phase may have higher resistance than the crystalline phase. A logic state '0', or reset state, may be associated with the amorphous phase of the storage element 25. A logic state '1', or set state, may be associated with the crystalline phase of the storage element 25.

The storage element 25 has a first terminal coupled to a node 28 of the respective bit line BL$_i$ and a second terminal coupled to a reference potential node, here to ground 29, through the selection element 26.

The selection element 26 is a switch, for example a BJT transistor, a diode or a MOS transistor, here an NMOS transistor, which is arranged in series with the respective storage element 25 and whose switching is controlled by the word line activation signal 21 of the respective word line WL$_j$.

In this embodiment, the NMOS transistor forming the selection element 26 has a source coupled, here directly connected, to the ground 29; a drain coupled, here directly connected, to the second terminal of the storage element 25; and a gate coupled, here directly connected, to the respective word line WL$_j$.

In practice, the storage element 25 and the selection element 26 form a current path of the respective memory cell 20; the selection element 26, in response to receiving the respective activation signal 21, closes the respective current path, thereby allowing the flow of a cell current $i_{cell}$ from the common node 28 to the ground 29.

The IMC device 10 may further comprise interface circuits 30 coupled to the bit lines BL$_i$, . . . , BL$_M$ which may be used, for example, to program the transconductance values $g_{ij}$ stored in the storage elements 25, in a per se know manner.

Furthermore, the IMC device 10 may also comprise a control circuit 31 operatively coupled to the word line activation circuit 14, the selectors 15, the digital detectors 16 and the interface circuits 30, to control these components of the IMC device 10. In particular, the control circuit 31 may generate the address signal ADR and the selection signals SEL, may control the interface circuits 30, and may receive the intermediate output data $dy_k$ and generate the final output vector Y as better described below.

Alternatively, the control circuit 31 may be external to the IMC device 10 and operatively coupled to the latter in a similar manner to what has been previously described. In this case, the IMC device 10 and the control circuit 31 are for example comprised in an in-memory computation apparatus (not shown).

In the embodiment here exemplarily considered, along each bit line BL$_i$ the memory cells 20 are operatively coupled two by two to form the memory groups 22. The memory cells 20 of each memory group 22 are connected to the same bit line BL$_i$ and to respective word lines WL$_j$ which are consecutive to each other and which form a respective sign word line group WL$_{n+,-}$.

In particular, each pair of memory cells 20 consecutive to each other along the bit line BL$_i$ considered forms a respective memory group 22, in such a way that each memory cell 20 is part of a single memory group 22 (i.e., the memory groups 22 do not share the same memory cells 20 with each other). Hereinafter, a specific memory group is also indicated with the reference 22$_{m,n}$, where m=1, . . . , M and n=1, . . . , N.

For example, the memory cells 20 which define the computational weights $g_{11}$ and $g_{12}$ form the memory group 22$_{1,1}$ and are respectively connected to the word lines WL$_{1+}$ and WL$_{1-}$ which together form the sign word line group WL$_{1+,-}$, the memory cells 20 which define the computational weights $g_{13}$ and $g_{14}$ form the memory group 22$_{1,2}$ and are respectively connected to the word lines WL$_{2+}$ and WL$_{2-}$ which together form the sign word line group WL$_{2+,-}$, the memory cells 20 which define the computational weights $g_{M(N-1)}$ and $g_{MN}$ form the memory group 22$_{M,N}$ and are respectively connected to the word lines WL$_{N+}$ and WL$_{N-}$ which together form the sign word line group WL$_{N+,-}$.

In other words, in the present embodiment the memory array 12 includes the memory groups 22$_{1,1}$ to 22$_{M,N}$ of memory cells 20, wherein each memory group 22$_{m,n}$ includes two memory cells 20 arranged in a 1×2 matrix configuration, where m is an integer from 1 to M and n is an integer from 1 to N. With this arrangement, there are N rows and M columns of memory groups 22$_{m,n}$ (where N=N'/2).

Each memory group 22$_{m,n}$ stores a respective signed computational weight for an in-memory calculation operation. In fact, each memory cell 20 may be programmed to store a datum equal to one bit ($g_{ij}$, where i is an integer from 1 to M and j is an integer from 1 to N'). Each computational weight $g_{ij}$ has a logic "1" value or a logic "0" value which is represented, for example, by a programmable transconductance in the memory cell 20.

In particular, a signed computational weight such as "+1" is represented by a programming logic "1" in the upper memory cell 20 and "0" in the lower memory cell 20 of the memory group 22$_{m,n}$ considered (e.g., $g_{11}$=1 and $g_{12}$=0) thus forming the matrix $$\begin{bmatrix} 1 \\ 0 \end{bmatrix};$$

a signed computational weight such as "−1" is represented by a programming logic "0" in the upper memory cell 20 and "1" in the lower memory cell 20 of the memory group $22_{m,n}$ considered (e.g., $g_{11}=0$ and $g_{12}=1$) thus forming the matrix $$\begin{bmatrix} 0 \\ 1 \end{bmatrix};$$

and a signed computational weight such as "O" is represented by a programming logic "0" in the upper memory cell 20 and "0" in the lower memory cell 20 of the memory group $22_{m,n}$ considered (e.g., $g_{11}=0$ and $g_{12}=0$) thus forming the matrix $$\begin{bmatrix} 0 \\ 0 \end{bmatrix}.$$

In this manner, for each sign word line group $WL_{n+,-}$ a positive word line $WL_{n+}$ connected to the upper memory cell 20 of the memory group $22_{m,n}$ considered and a negative word line $WL_{n-}$ connected to the lower memory cell 20 of the memory group $22_{m,n}$ considered are present.

Figure 2:
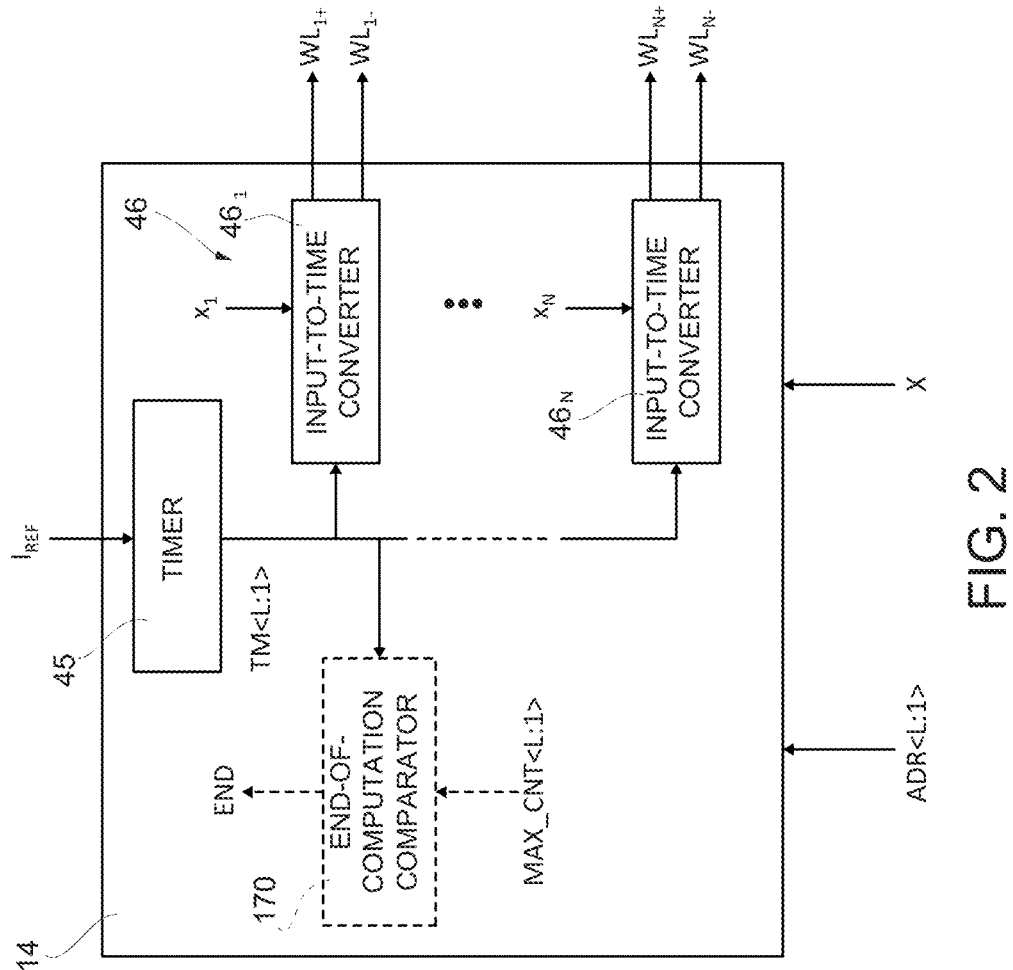

FIG. 2 shows a detailed and exemplary embodiment of the word line activation circuit 14 comprising a timer (or main counter) 45 providing a timer signal TM, and a plurality of input-to-time converters 46, one for each sign word line group $WL_{n+,-}$. For example, the timer signal TM is in gray code.

The plurality of input-to-time converters 46 each receive the timer signal TM and the respective input value $X_n$ and, in response, provide two respective word line activation signals 21 (one for the respective positive word line $WL_{j+}$ and one for the respective negative word line $WL_{j-}$ of the sign word line group $WL_{n+,-}$).

The word line activation circuit 14 also receives an address signal ADR indicating which word lines $WL_j$ to activate to perform an in-memory calculation. For example, the address signal ADR may be used to cause the activation, in use, of only some of the sign word line groups $WL_{n+,-}$, for example if the input vector X has a number of values lower than the number N of sign word line groups $WL_{n+,-}$ of the memory array 12.

For example, the address signal ADR may be an N-bit digital signal $ADR_n$, with n=1, N (i.e., one for each sign word line group $WL_{n+,-}$). Each bit of the address signal ADR corresponds to a respective sign word line group $WL_{n+,-}$ and may for example be equal to logic 1 in case the respective sign word line group $WL_{n+,-}$ is to be enabled or it may be equal to logic 0 in case the respective sign word line group $WL_{n+,-}$ is to be disabled. For example, ADR='111 . . . 1000' implies that the last three sign word line groups $WL_{n+,-}$ are not used while the remaining sign word line groups $WL_{n+,-}$ are used.

According to one embodiment, the timer 45 provides the timer signal TM starting from a supply current, hereinafter referred to as reference current $I_{REF}$. For example, the reference current $I_{REF}$ is generated by a current source (of known type and indicated in FIG. 3 with the reference 32), in a per se known manner.

The timer signal TM is an L-bit digital signal, indicated hereinafter and in the Figures also as timer signal TM<L:1>, which increases over time at an update frequency $f_u$ function of the reference current $I_{REF}$.

In practice, the timer signal TM is a counter signal.

The timer 45 may reset the timer signal TM to a start value, for example to zero, at the beginning of a new computation that is to be performed by the IMC device 10, for example in response to receiving a start signal from a user of the IMC device 10.

According to an embodiment, again with reference to FIG. 2, the word line activation circuit 14 may further comprise an end-of-computation comparator 170.

The end-of-computation comparator 170 receives the timer signal TM<L:1> and a maximum count signal MAX_COUNT<L:1> and provides, in response, an end-of-count signal END.

The maximum count signal MAX_COUNT<L:1> may be configured by a user of the IMC device 10 and indicates the maximum duration of a calculation performed by the IMC device 10. For example, the maximum count signal MAX_COUNT<L:1> may indicate a maximum duration equal to or greater than the time that any of the intermediate output data $dy_k$ would take to reach the respective maximum value, for example all F bits equal to 1, when all the memory cells 20 associated with the respective bit line $BL_i$ are activated. However, the maximum count signal MAX_COUNT<L:1> may indicate a lower maximum duration, for example if it is desired to obtain a shorter computation time by the IMC device 10.

An exemplary and non-limiting embodiment of the timer 45 is described in detail with reference to FIGS. 3 and 4.

Figure 3:
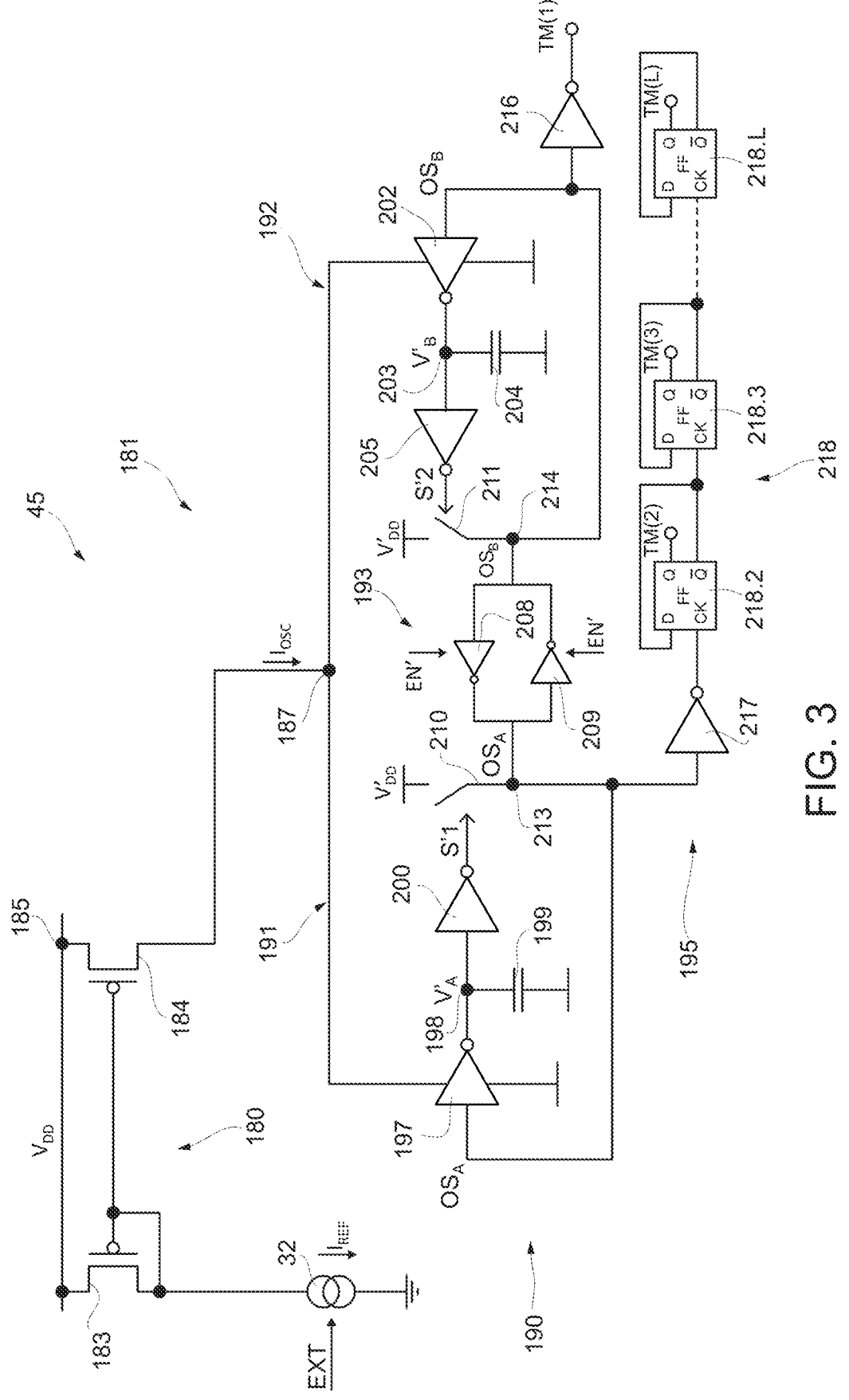

In FIG. 3, the timer 45 comprises a current mirror 180 which generates an oscillator current $I_{OSC}$ starting from the reference current $I_{REF}$, and a count portion 181 which provides the timer signal TM starting from the oscillator current $I_{OSC}$.

The current mirror 180 has a mirroring ratio 1:p, so that the oscillator current $I_{OSC}$ is $p \cdot I_{REF}$.

In detail, the current mirror 180 has a first branch, here formed by a respective PMOS transistor 183, coupled to the current source 32, and a second branch, here formed by a respective PMOS transistor 184, coupled to the count portion 181.

The sources of the PMOS transistors 183, 184 are coupled to a supply node 185, here at a supply voltage $V_{DD}$, the gates of the PMOS transistors 183, 184 are mutually coupled to each other and to the drain of the PMOS transistor 183. The drain of the PMOS transistor 184 is coupled, in particular here directly connected, to an input node 187 of the count portion 181.

The count portion 181 of the timer 45 comprises an integration stage 190, here formed by a first integration circuit 191, a second integration circuit 192 and a switching circuit 193 coupled between the first and the second integration circuits 191, 192, and a counter stage 195 which is coupled to the integration stage 190 and provides the timer signal TM.

The first and the second integration circuits 191, 192 are coupled to the input node 187 so as to receive the oscillator current $I_{OSC}$.

The first integration circuit 191 comprises a first inverter 197 having an output 198, a capacitor 199 of capacitance C'A coupled to the output 198 of the first inverter 197, and a second inverter 200 whose input is coupled to the output 198 of the first inverter 197.

The first inverter 197 has a supply node coupled to the input node 187 of the count portion 181 (FIG. 4) and receives at input a first oscillator control signal $OS_A$.

In practice, the first inverter 197 is biased by the oscillator current $I_{OSC}$.

The capacitor 199 has a first terminal coupled to the output node 198 of the first inverter 197 and a second terminal coupled to a reference potential node, here to ground.

The output node 198 of the first inverter 197 is at a first oscillator integration voltage V'A which drops across the capacitor 199.

The second inverter 200 has a first oscillator threshold $V'_{th1}$, hereinafter simply referred to as first threshold $V'_{th1}$, receives at input the first oscillator integration voltage V'A and provides at output a first oscillator switch signal S'1 as a function of the first threshold $V'_{th1}$ and of the first oscillator integration voltage $V'_A$.

In detail, when the first oscillator integration voltage $V'_A$ is lower than the first threshold $V'_{th1}$, the first oscillator switch signal S'1 has a high logic value. When the first oscillator integration voltage $V'_A$ is higher than the first threshold $V'_{th1}$, the first oscillator switch signal S'1 has a low logic value.

The second integration circuit 192 comprises a first inverter 202 having an output 203, a capacitor 204 of capacitance $C'_B$ coupled to the output 203 of the first inverter 202, and a second inverter 205 whose input is coupled to the output 203 of the first inverter 202.

The first inverter 202 has a supply node coupled to the input node 187 of the count portion 181 (FIG. 4) and receives at input a second oscillator control signal $OS_B$.

In practice, the first inverter 202 is biased by the oscillator current $I_{OSC}$.

The capacitor 204 has a first terminal coupled to the output node 203 of the first inverter 202 and a second terminal coupled to a reference potential node, here to ground.

The output node 203 of the first inverter 202 is at a second oscillator integration voltage $V'_B$ which drops across the capacitor 204.

The second inverter 205 has a second oscillator threshold $V'_{th2}$, hereinafter simply referred to as second threshold $V'_{th2}$, receives at input the second oscillator integration voltage $V'_B$ and provides at output a second oscillator switch signal S'2 as a function of the second threshold $V'_{th2}$ and of the second oscillator integration voltage $V_B$.

In detail, when the second oscillator integration voltage $V_B$ is lower than the second threshold $V'_{th2}$, the second oscillator switch signal S'2 has a high logic value. When the second oscillator integration voltage $V'_B$ is higher than the second threshold $V'_{th2}$, the second oscillator switch signal S'2 has a low logic value.

The switching circuit 193 is a latch formed by two inverters 208, 209 arranged in a ring configuration, a first switch 210 controlled by the first oscillator switch signal S'1 and a second switch 211 controlled by the second oscillator switch signal S'2.

The switching circuit 193 has a first node 213 coupled to the input of the inverter 209 and to the output of the inverter 208, and a second node 214 coupled to the output of the inverter 209 and to the input of the inverter 208.

The first node 213 provides the first oscillator control signal $OS_A$. The second node 214 provides the second oscillator control signal $OS_B$.

The first switch 210 is coupled between the first node 213 and a node at voltage $V'_{DD}$, the second switch 211 is coupled between the second node 214 and the node at voltage $V'_{DD}$. In the embodiment of FIG. 3, the switching circuit 193 also receives an oscillator enable signal EN', which controls the activation of the switching circuit 193. For example, the oscillator enable signal EN' may be used to maintain the switching circuit 193 off when not in use, thereby allowing power consumption to be optimized. Furthermore, the enable signal EN' may be used to set the switching circuit 193 to a defined state, for example when the IMC device 10 is switched on.

The counter stage 195 is coupled to the first and the second nodes 213, 214 of the switching circuit 193.

In detail, the charge counter stage 195 comprises an inverter 216, whose input is coupled to the second node 214, and a counter comprising an inverter 217 whose input is coupled to the first node 213 and a plurality of D-type flip-flops 218 including a first flip-flop 218.2, a second flip-flop 218.3 and a last flip-flop 218.L, wherein L is the number of bits of the timer signal TM<L:1>.

In practice, the counter of the charge counter stage 195 has L–1 flip-flops 218.

The output of the inverter 216 provides the first bit TM(1), i.e., the least significant bit, of the timer signal TM.

The flip-flops 218 are cascaded with each other, sequentially from the first flip-flop 218.2 to the last flip-flop 218.L.

The flip-flops 218 each have a clock input (CK-input), a data input (D-input), a Q-output and a $\overline{Q}$-output.

The CK-input of the first flip-flop 218.2 is coupled to the output of the inverter 217. The $\overline{Q}$-output of the first flip-flop 218.2 is fed back to the D-input of the first flip-flop 218.2. The $\overline{Q}$-output of the first flip-flop 218.2 is the second bit TM(2) of the timer signal TM<L:1>.

The CK-input of the second flip-flop 218.3 is coupled to the $\overline{Q}$-output of the first flip-flop 218.2. The $\overline{Q}$-output of the second flip-flop 218.3 is fed back to the D-input of the second flip-flop 218.3. The $\overline{Q}$-output of the second flip-flop 218.3 is the third bit TM(3) of the timer signal TM<L:1>.

What has been described for the second flip-flop 218.3 applies, mutatis mutandis, for all the successive flip-flops, here not shown, up to the L-1-th flip-flop, also not shown.

Finally, the CK-input of the last flip-flop 218.L is coupled to the $\overline{Q}$-output of the L-1-th flip-flop. The $\overline{Q}$-output of the last flip-flop 218.L is fed back to the D-input of the last flip-flop 218.L. The $\overline{Q}$-output of the last flip-flop 218.L is the most significant bit TM(L) of the timer signal TM<L:1>.

Figure 4:
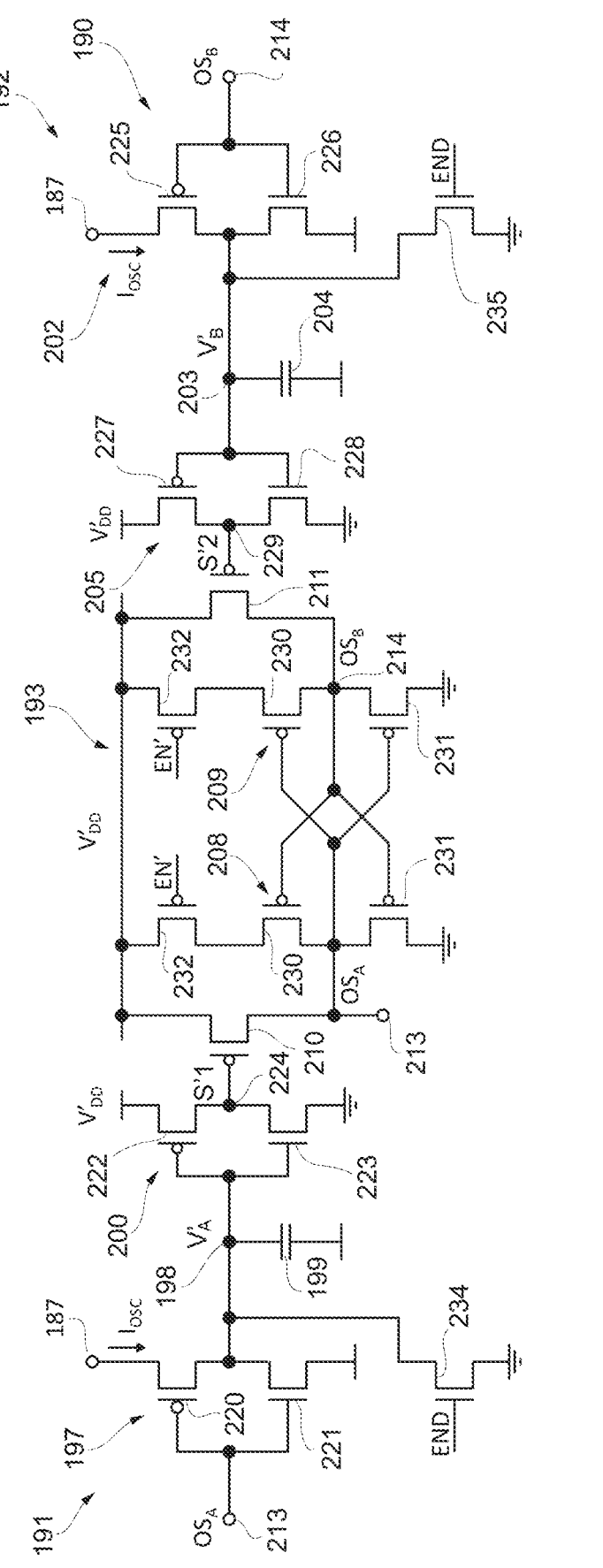

With reference to the detailed implementation of the integration stage 190 shown in FIG. 4, the first inverter 197 of the first integration circuit 191 is a CMOS inverter formed by the series circuit of a PMOS transistor 220 and a NMOS transistor 221, mutually coupled to the output node 198. The PMOS and NMOS transistors 220, 221 receive the first oscillator control signal $OS_A$ at the respective gate terminals.

The source of the PMOS transistor 220 is coupled to the input node 187 of the integration stage 190 of the timer 45.

The second inverter 200 of the first integration circuit 191 is a CMOS inverter formed by the series circuit of a PMOS transistor 222 and a NMOS transistor 223, mutually coupled to a node 224 providing the first oscillator switch signal S'1.

The first threshold $V'_{th1}$ of the second inverter 200 is the switching threshold of the second inverter 200, and therefore depends on the properties, for example on the threshold or on-state resistance, of the PMOS and NMOS transistors 222, 223. In practice, the switching threshold may be the input voltage for which the output of the inverter has a high logic value or the input voltage for which the output of the inverter has a low logic value.

For example, the switching threshold of the second inverter 200 may be defined as the operating point at which the respective input voltage, i.e., the first oscillator integration voltage $V'_A$, is equal to the respective output voltage, i.e., the first oscillator switch signal S'1.

The first inverter 202 of the second integration circuit 192 is a CMOS inverter formed by the series circuit of a PMOS transistor 225 and a NMOS transistor 226, mutually coupled to the output node 203. The PMOS and NMOS transistors 225, 226 receive the second oscillator control signal $OS_B$ at the respective gate terminals.

The source of the PMOS transistor 225 is coupled to the input node 187 of the count portion 190 of the timer 45.

The second inverter 205 of the second integration circuit 192 is a CMOS inverter formed by the series circuit of a PMOS transistor 227 and a NMOS transistor 228, mutually coupled to a node 229 providing the second oscillator switch signal S'2.

The second threshold $V'_{th2}$ of the second inverter 205 is the switching threshold of the second inverter 205, and therefore depends on the properties, for example on the threshold or on-state resistance, of the PMOS and NMOS transistors 227, 228. In practice, the switching threshold may be the input voltage for which the output of the inverter has a high logic value or the input voltage for which the output of the inverter has a low logic value.

For example, the switching threshold of the second inverter 205 may be defined as the operating point at which the respective input voltage, i.e., the second oscillator integration voltage $V'_B$, is equal to the respective output voltage, i.e., the second oscillator switch signal S'2.

As shown in the detailed implementation of FIG. 4, the first and the second inverters 208, 209 of the switching circuit 193 are cross-coupled CMOS inverters each comprising a respective PMOS transistor 230 and a respective NMOS transistor 231 mutually coupled in series between a supply node, here at voltage $V'_{DD}$, and ground.

Furthermore, the first and the second inverters 208, 209 of the switching circuit 193 each also comprise a respective enable switch, here a PMOS transistor 232, which is coupled between the supply node at voltage $V'_{DD}$ and the PMOS transistor 230 of the respective inverter.

The PMOS transistors 232 are controlled by the oscillator enable signal EN'.

In this embodiment, the timer 45 comprises, with reference to FIG. 4, a first and a second stopping switch, here a first and a second NMOS transistor 234, 235, which are configured to stop updating the timer signal TM by the timer 45.

In detail, the first and the second NMOS transistors 234, 235 have: a drain terminal coupled to the output nodes 198, 203 of the first and, respectively, the second integration circuits 191, 192; and a source terminal coupled to a reference, here ground. The first and the second NMOS transistors 234, 235 receive, at the respective gate terminals, the end-of-count signal END generated by the end-of-computation comparator 170.

When the end-of-computation comparator 170 (FIG. 2) switches the end signal END to the high logic value, the first and the second NMOS transistors 234, 235 are switched on, thereby short-circuiting to ground the output nodes 198, 203 of the first and the second integration circuits 191, 192.

Consequently, the timer 45 stops updating the timer signal TM.

Therefore, the timer 45 generates the timer signal TM<L:1> by performing a number of successive timing iterations. In each timing iteration, for example with reference to a timing iteration wherein the oscillator current $I_{OSC}$ flows through the first integration circuit 191, the integration stage 190 generates the first oscillator integration voltage V'A as time integral of the oscillator current $I_{OSC}$, compares the first oscillator integration voltage $V'_A$ with the first threshold $V'_{th,1}$ and, in response to the first oscillator integration voltage $V'_A$ reaching the first threshold $V'_{th,1}$, resets the first oscillator integration voltage $V'_A$, in particular here by switching the first oscillator control signal $OS_A$. The counter stage 195 updates the timer signal TM<L:1> in response to the first oscillator integration voltage $V'_A$ reaching the first threshold $V'_{th,1}$. In this embodiment, the least significant bit of the timer signal TM is the value of the second oscillator control signal $OS_B$.

In other words, the timer 45 samples the oscillator current $I_{OSC}$ by converting the oscillator current $I_{OSC}$ into a number of charge packets and counting said charge packets, wherein each charge packet corresponds to the charge accumulated on the capacitors 199, 204 which causes a switching of the second inverters 200, 205.

As a result, the update frequency $f_u$ of the timer signal TM<L:1> is given by the frequency of the switching events of the first oscillator control signal $OS_A$. The update frequency $f_u$ therefore depends on the value of the oscillator current $I_{OSC}$, i.e., the reference current $I_{REF}$ and on the mirror factor p of the current mirror 180, the capacitances $C'_A$, C'B, and the first and the second thresholds $V'_{th,1}$, $V'_{th,2}$ of the second inverters 200, 205.

In practice, the integration stage 190 of the timer 45 behaves as a current-controlled oscillator.

Figure 5A:
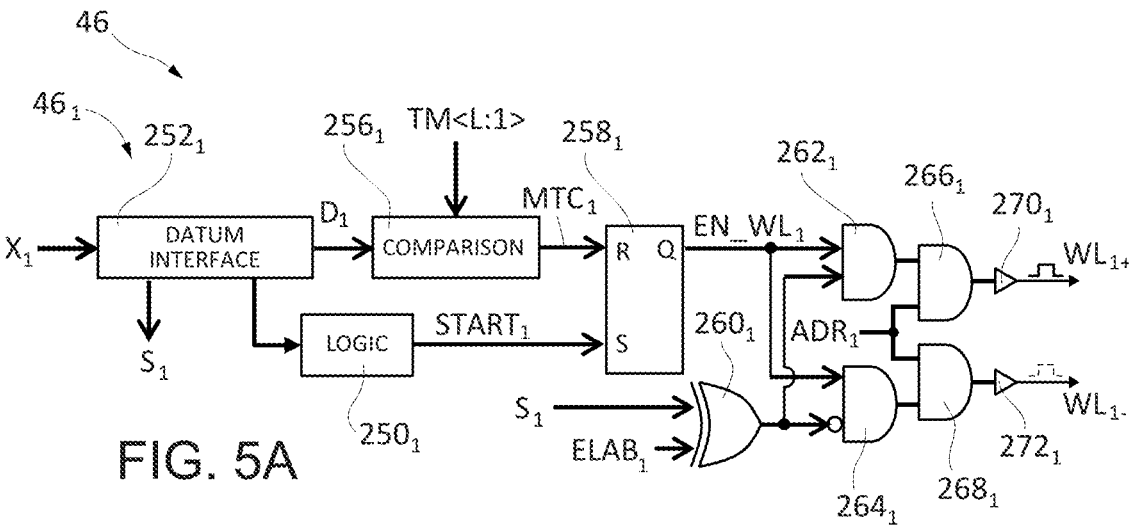
Figure 5B:
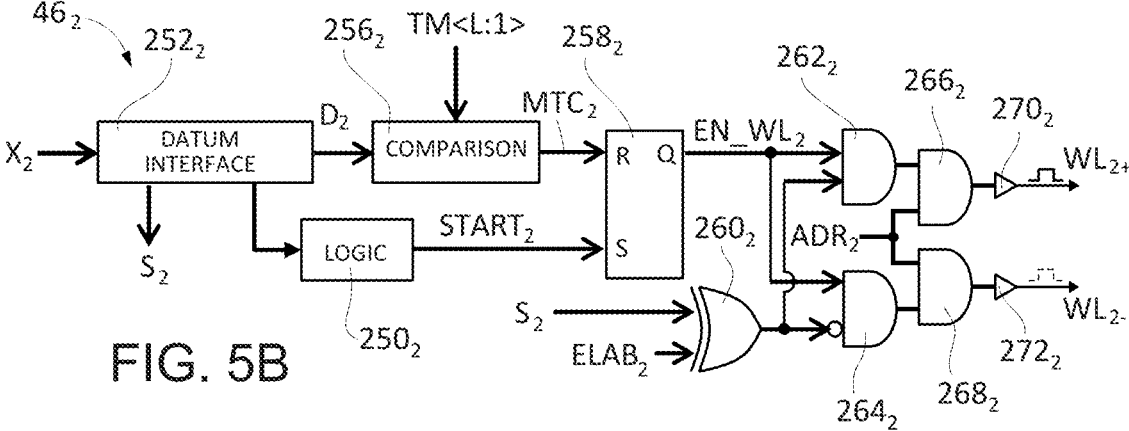
Figure 5C:
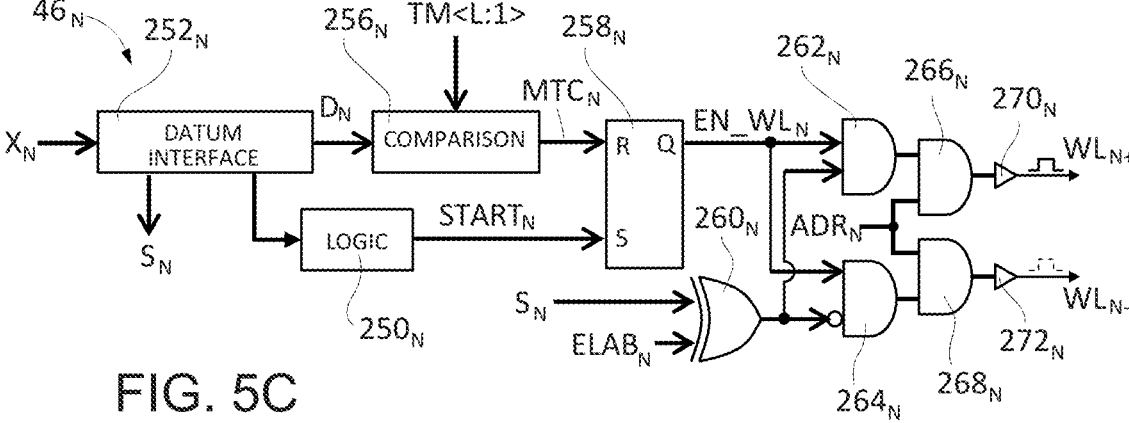

With reference to FIGS. 5A-5C, an embodiment of the input-to-time converters 46 is now described. In particular and purely by way of example, FIGS. 5A-5C show the input-to-time converters $46_1$, $46_2$ and $46_N$, respectively, which are configured to be connected to the respective sign word line groups $WL_{1+,-}$, $WL_{2+,-}$ and $WL_{N+,-}$; it is clear that the remaining input-to-time converters $46_n$, not shown not to obscure unnecessarily the view and understanding, have a structure similar to that of the input-to-time converters $46_1$, $46_2$ and $46_N$ which are shown here.

Each input-to-time converter $46_n$ is connected to the word lines $WL_j$ of the respective sign word line group $WL_{n+,-}$, as previously described.

Figure 6A:
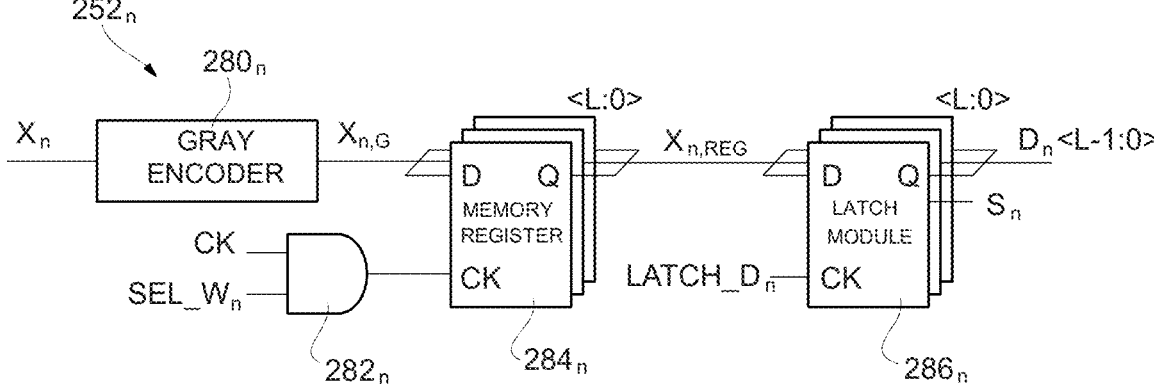

The input-to-time converter $46_n$ comprises a datum interface circuit $252_n$ which identifies a sign $S_n$ and a value $D_n$ of the input datum $x_n$. An example of the datum interface circuit $252_n$, is shown in FIG. 6A and better discussed below.

The input-to-time converter $46_n$ may further comprise a logic circuit $250_n$ which generates a respective start signal $START_n$, for example in response to a global start signal received by the IMC device 10, at the beginning of each MAC processing step. The start signal $START_n$ is indicative of the beginning of the MAC processing step and therefore of a current calculation iteration. The generation of the start signal $START_n$ may, for example, depend on the corresponding signed value of the input datum $x_n$ (e.g., $START_n$ is generated when $x_n$ is different from zero) and occurs in a per se known manner. Alternatively, the start signal $START_n$ may for example be generated by the control circuit 31.

Figure 6B:
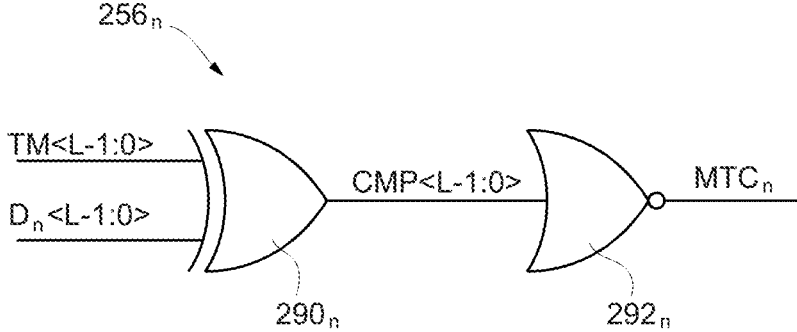

The input-to-time converter $46_n$ further comprises a comparison circuit $256_n$, coupled to the datum interface circuit $252_n$. The comparison circuit $256_n$ receives at input the value $D_n$ of the input datum $x_n$ and the timer signal TM<L:1> and compares them with each other to generate a corresponding match signal $MTC_n$. The comparison circuit $256_n$ asserts the match signal MTC to the high logic value when the timer signal TM<L:1> becomes equal to the value $D_n$ of the input datum $x_n$. An example of the comparison circuit $256_n$ is shown in FIG. 6B and better discussed below.

The input-to-time converter $46_n$ further comprises a set-reset circuit $258_n$ (in particular, an SR-type flip-flop) which has a set input(S) coupled to the logic circuit $250_n$ to receive the start signal $START_n$, and has a reset input (R) coupled to the comparison circuit $256_n$ to receive the match signal $MTC_n$. On the basis of these inputs, the set-reset circuit $258_n$ generates at output (Q) a word line enable signal $EN\_WL_n$ which assumes a high logic value when the start signal $START_n$ assumes the high logic value, which maintains as long as the match signal MTC does not go to the high logic value.

The input-to-time converter $46n$ further comprises an enable logic circuit $260_n$, which is coupled to the datum interface circuit $252_n$, receives at input the sign $S_n$ of the input datum $x_n$ and an elaboration signal $ELAB_n$ (for example generated by the control circuit 31) and logically combines them to each other. In particular, the logic state of the elaboration indicator signal $ELAB_n$ indicates whether a first (positive) elaboration is being carried out or whether a second (negative) elaboration is being performed, as better described below. In one embodiment, the enable logic circuit $260_n$, is an exclusive OR (XOR) logic gate.

The input-to-time converter $46_n$ further comprises a first combinatorial logic circuit $262_n$ (in particular, an AND logic gate) which is coupled to the output Q of the set-reset circuit $258_n$ and to the output of the enable logic circuit $260_n$, receives at input the word line enable signal $EN\_WL_n$ and the output of the enable logic circuit $260_n$ and logically combine them to each other to generate an intermediate driver signal for the positive word line $WL_{n+}$ of the sign word line group $WL_{n+,-}$.

The input-to-time converter $46_n$ further comprises a second combinatorial logic circuit $264_n$ (in particular, an AND logic gate) which is coupled to the output Q of the set-reset circuit $258_n$ and, in a logically negated manner, to the output of the enable logic circuit $260_n$, receives at input the word line enable signal $EN\_WL_n$ and the logic inverse of the output of the enable logic circuit $260_n$ and logically combine them to each other to generate an intermediate driver signal for the negative word line $WL_{n-}$ of the sign word line group $WL_{n+,-}$.

Optionally, the input-to-time converter $46_n$ may further comprise a third and a fourth combinatorial logic circuit $266_n$ and $268_n$ (in particular, AND logic gates). The third combinatorial logic circuit $266_n$ is coupled to the output of the first combinatorial logic circuit $262_n$, receives at input the respective intermediate driver signal and the address signal $ADR_n$ (i.e., the n-th bit of the address signal ADR) for the respective sign word line group $WL_{n+,-}$ and logically combines them to each other to generate a driver signal for the positive word line $WL_{n+}$ of the sign word line group $WL_{n+,-}$. The fourth combinatorial logic circuit $268_n$ is coupled to the output of the second combinatorial logic circuit $264_n$, receives at input the respective intermediate driver signal and the address signal $ADR_n$ for the respective sign word line group $WL_{n+,-}$ and logically combines them to each other to generate a driver signal for the negative word line $WL_{n-}$ of the sign word line group $WL_{n+,-}$. In this manner it is possible to select the sign word line groups $WL_{n+,-}$ to be used, disabling some of them in case not all of them are required (for example if the input vector X has a number of values lower than the number N of sign word line groups $WL_{n+,-}$ of the memory array 12); in this case, the address signals $ADR_n$ of the sign word line groups $WL_{n+,-}$ to be disabled may be set to low logic values in such a way that the respective driver signals assume low logic values. Alternatively, in the absence of the third and the fourth combinatorial logic circuits $266_n$, and $268_n$ the intermediate driver signals coincide with the driver signals.

The input-to-time converter $46_n$ further comprises a first and a second word line driver circuit $270_n$, and $272_n$. The first word line driver circuit $270_n$ is coupled to the third combinatorial logic circuit $266_n$ and to the positive word line $WL_{n+}$ of the sign word line group $WL_{n+,-}$. The second word line driver circuit $272_n$, is coupled to the fourth combinatorial logic circuit $268_n$ and to the negative word line $WL_{n-}$ of the sign word line group $WL_{n+,-}$. In this manner, each word line $WL_j$ is driven by the respective word line driver circuit which generates the respective word line activation signal 21 on the basis of the respective driver signal, in a per se known manner. The word line driver circuits $270_n$ and $272_n$ may each be implemented as a CMOS driver circuit (for example, a circuit with two pairs of p- and n-channel MOSFET transistors, cascaded to each other, which form a buffer circuit).

FIG. 6A shows in detail an example of the datum interface circuit $252_n$.

In this exemplary and non-limiting embodiment wherein the timer signal TM is in gray code, the datum interface circuit $252_n$ comprises a gray encoder $280_n$ which receives at input the input datum $X_n$ (in a format other than the gray format) and converts it into a gray input datum $X_{n,G}$ in gray format, in a per se known manner.

The datum interface circuit $252_n$ further comprises a combinatorial logic circuit $282_n$ (in particular, an AND logic gate) having a first input which receives a clock signal CK and a second input which receives a write enable signal $SEL\_W_n$ (for example generated by the control circuit 31).

The datum interface circuit $252_n$ further comprises a memory register $284_n$ of <L:0> type comprising L D-type flip-flops. In detail, each flip-flop of the memory register $284_n$ has a clock input (CK) connected to an output of the combinatorial logic circuit $282_n$ and has a datum input (D) connected to the gray encoder $280_n$ in such a way as to receive the gray input datum $X_{n,G}$ and store it in the memory register $284_n$ as a register datum $X_{n,REG}$.

In particular, the write enable signal $SEL\_W_n$ received by the combinatorial logic circuit $282_n$ is indicative of the addressing towards the memory register $284_n$ and therefore of the enabling or not of this memory register $284_n$. This allows to reduce the number of electrical signals generated by the control circuit 31 and managed by the word line activation circuit 14, with respect to the number of memory registers $284_n$ to be controlled.

The datum interface circuit $252_n$ further comprises a latch module $286_n$ of <L:0> type and comprising L D-type flip-flops. In detail, each flip-flop of the latch module $286_n$ has a clock input (CK) configured to receive a latch signal $LATCH\_D_n$ (for example generated by the control circuit 31) and has a datum input (D) connected to the output (Q) of a respective flip-flop of the memory register $284_n$ in such a way as to receive the register datum $X_{n,REG}$ and store it in the latch module $286_n$. In particular, a first flip-flop of the latch module $286_n$ stores the sign $S_n$ of the register datum $X_{n,REG}$ (therefore, of the input datum $x_n$) and the remaining flip-flops of the latch module $286_n$ store the bits corresponding to the value $D_n$ of the register datum $X_{n,REG}$ (therefore, of the input datum $x_n$). The storage of the register datum $X_{n,REG}$ in the latch module $286_n$ occurs, owing to the latch signal $LATCH\_D_n$, in such a way as to save at the current calculation iteration the register datum $X_{n,REG}$ required for the immediately successive calculation iteration; consequently, the latch signal $LATCH\_D_n$ allows the register datum $X_{n,REG}$ stored in the latch module $286n$ to be suitably updated.

FIG. 6B shows an exemplary and non-limiting embodiment of the comparison circuit $256_n$.

In FIG. 6B, the comparison circuit $256_n$ comprises a first comparison block $290_n$ having a first input coupled to the timer 45 to receive the timer signal TM<L:1> and a second input coupled to the datum interface circuit $252_n$ (in particular, to the flip-flops of the latch module $286_n$ which store the value $D_n$ of the input datum $x_n$) to receive the value $D_n$ of the input datum $X_n$. The first comparison block $290_n$ generates at output a comparison signal CMP indicative of the comparison between the timer signal TM<L:1> and the value $D_n$ of the input datum $X_n$. In particular, the first comparison block $290_n$ is an exclusive OR (XOR) logic gate.

The comparison circuit $256_n$ further comprises a second comparison block $292_n$ having an input connected to the output of the first comparison block $290_n$ and configured to receive the comparison signal CMP. The second comparison block $292_n$ generates at output the match signal $MTC_n$ on the basis of the comparison signal CMP. In particular, the second comparison block $292_n$ is a bit-by-bit-type negated OR logic gate.

Figure 7B:
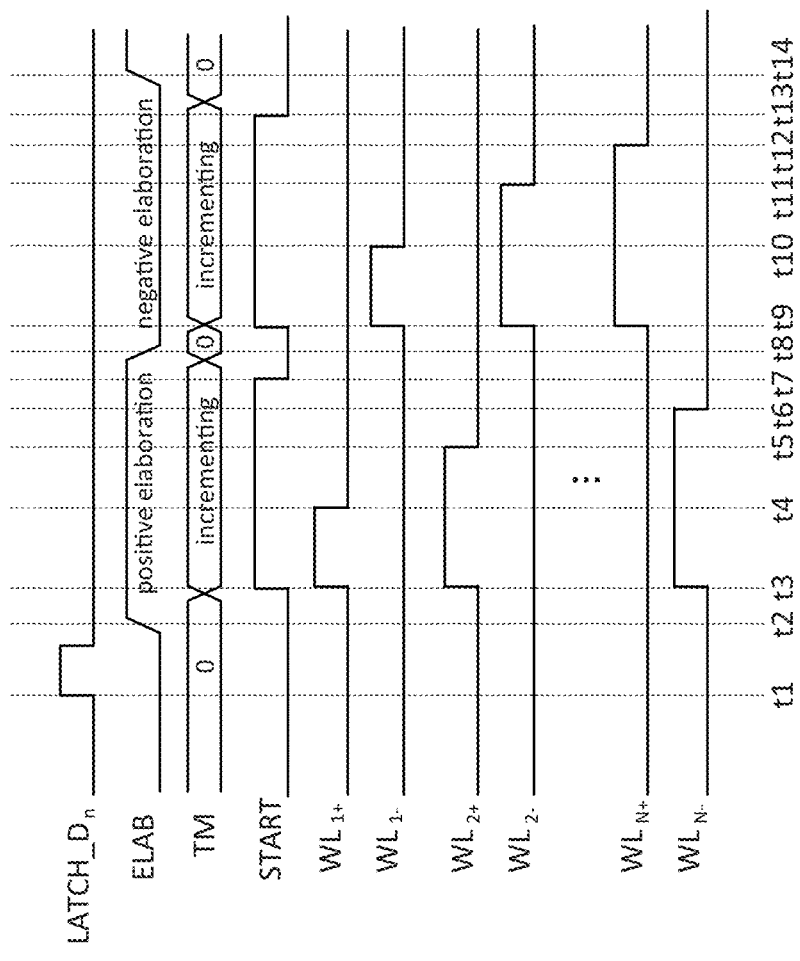
Figure 7A:
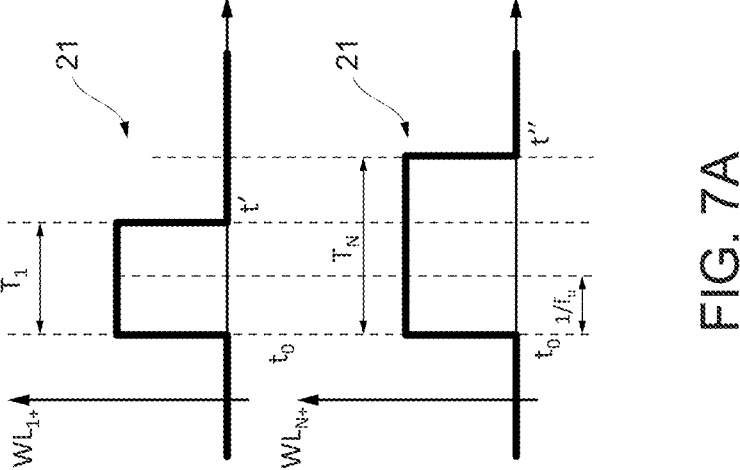

FIG. 7A shows, by way of example, the word line activation signals 21 of the first positive word line $WL_{1+}$ and of the last positive word line $WL_{N+}$. At the beginning of a computation by the IMC device 10 (time to) the timer signal TM is reset to the start value and the input-to-time converters 46 each switch the respective word line activation signal 21 to the high value.

In the example of FIG. 7A, the input value $x_1$ associated with the first positive word line $WL_{1+}$ is lower than the input value $X_N$ associated with the last positive word line $WL_{N+}$; therefore, the input-to-time converter 46 associated with the first positive word line $WL_{1+}$ maintains the respective word line activation signal 21 at the high value for a shorter time with respect to the input-to-time converter 46 associated with the last positive word line $WL_{N+}$. This entails that the word line activation signal 21 of the first positive word line $WL_{1+}$ has an activation length $T_1$ which is lower than the activation length $T_N$ of the word line activation signal 21 of the last positive word line $WL_{N+}$.

The operation of the word line activation circuit 14 is now described. In particular, only one iteration of in-memory calculation relating to a respective input vector X to be processed is described herein; nevertheless the following steps may be similarly repeated for each new input vector X to be processed, performing a respective number of calculation iterations.

At the beginning of the in-memory calculation iteration, the timer 45 is initialized and the decoding of the address signal ADR is used to select the input-to-time converters 46 to be used concurrently for data elaboration.

For each input-to-time converter $46_n$, if the respective input datum $x_n$ is different from zero, a high logic value of the start signal $START_n$ is set at the beginning of each positive/negative elaboration by the logic circuit $250_n$ and the set-reset circuit $258_n$ is set with the output Q at a high logic value. The logic state of the elaboration signal $ELAB_n$ indicates whether the positive elaboration (logic 1) or the negative elaboration (logic 0) is in progress.

In fact, each calculation iteration comprises a first (positive) and a second (negative) data elaboration step. During each data elaboration step a single word line $WL_{n+}/WL_{n-}$ is activated with the word line activation signal 21 for each sign word line group $WL_{n+,-}$. In other words, for each sign word line group $WL_{n+,-}$ enabled through the address signal ADR, only one word line $WL_{n+}/WL_{n-}$ is active in each data elaboration step and therefore the case in which both the positive word line $WL_{n+}$ and the negative word line $WL_{n-}$ of a same sign word line group $WL_{n+,-}$ are concurrently active never occurs. This selection of the word line $WL_{n+}/WL_{n-}$ to be used in a given data elaboration step occurs on the basis of the following factors: a) which (positive or negative) elaboration has been performed in the data elaboration step immediately preceding the one considered, and b) the sign $S_n$ of the input datum $X_n$.

One of the following four cases may occur.

Case 1: if the sign $S_n$ is logic 0 (i.e., the input datum $x_n$ is positive) and the elaboration signal $ELAB_n$ is logic 1 (i.e., the data elaboration step immediately preceding the one considered is positive), the inputs of the enable logic circuit $260_n$ are different and the output of the enable logic circuit $260_n$ assumes a high logic value so that both inputs of the first combinatorial logic circuit $262_n$ assume a high logic value and the output of the first combinatorial logic circuit $262_n$ assumes a high logic value to provide the word line activation signal 21 to the positive word line $WL_{n+}$.

Case 2: if the sign $S_n$ is logic 1 (i.e., the input datum $x_n$ is negative) and the elaboration signal $ELAB_n$ is logic 1 (i.e., the data elaboration step immediately preceding the one considered is positive), the inputs of the enable logic circuit $260_n$ are equal and logic 1s and the output of the enable logic circuit $260_n$ assumes a low logic value so that both inputs of the second combinatorial logic circuit $264_n$ assume a high logic value and the output of the second combinatorial logic circuit $264_n$ assumes a high logic value to provide the word line activation signal 21 to the negative word line $WL_{n-}$.

Case 3: if the sign $S_n$ is logic 0 (i.e., the input datum $x_n$ is positive) and the elaboration signal $ELAB_n$ is logic 0 (i.e., the data elaboration step immediately preceding the one considered is negative), the inputs of the enable logic circuit $260_n$ are equal and logic 0s and the output of the enable logic circuit $260_n$ assumes a low logic value so that both inputs of the second combinatorial logic circuit $264_n$ assume a high logic value and the output of the second combinatorial logic circuit $264_n$ assumes a high logic value to provide the word line activation signal 21 to the negative word line $WL_{n-}$.

Case 4: if the sign $S_n$ is logic 1 (i.e., the input datum $x_n$ is negative) and the elaboration signal $ELAB_n$ is logic 0 (i.e., the data elaboration step immediately preceding the one considered is negative), the inputs of the enable logic circuit $260_n$ are different and the output of the enable logic circuit $260_n$ assumes a high logic value so that both inputs of the first combinatorial logic circuit $262_n$ assume a high logic value and the output of the first combinatorial logic circuit $262_n$ assumes a high logic value to provide the word line activation signal 21 to the positive word line $WL_{n+}$.

The timer 45 starts to increment the value of the timer signal TM and a data elaboration step is thus performed, until the incremental count value of the timer signal TM equals the value of the input datum $x_n$ saved in the datum interface circuit $252_n$.

When the incremental count value of the timer signal TM equals the value of the input datum $X_n$ saved in the datum interface circuit $252_n$, the output of the comparison circuit $256_n$ assumes the high logic value and the set-reset circuit $258_n$ has the output Q with low logic value. This low logic output is applied to the first and the second combinatorial logic circuits $262_n$ and $264_n$, which thus both switch to a low logic value generating the end of the word line activation signal 21 at the sign word line group $WL_{n+,-}$. The duration of the pulse of the word line activation signal 21 (i.e., the activation length $T_n$) therefore depends on the amount of time required for the value of the timer signal TM to equal the value of the input datum $x_n$.

For each input vector X, a calculation iteration is performed and therefore two elaboration steps consecutive to each other (one positive and the other negative, as better described hereinbelow) are performed. Each step ends when all the incremental count values of the timer signals TM have equaled the values of the respective input data $x_n$. When both elaboration steps end, the respective calculation iteration also ends.

Finally, data processing ends when the end-of-count signal END is generated in response to the fact that the count of the timer signal TM equals the count of the maximum count signal MAX_COUNT.

Reference is now made to FIG. 7B which shows a simplified timing diagram for the operation of the word line activation circuit 14, relating to an exemplary in-memory calculation iteration comprising the two separate elaboration steps.

At time t1, the latch signal LATCH_D$_n$ is switched to cause the datum interface circuits 252$_n$ to store the signed values of the input data $x_n$, and the in-memory calculation operation begins.

At time t2, the elaboration signal ELAB$_n$ switches to logic 1 in connection with the start of the first (positive) elaboration of the in-memory calculation operation. For the sake of simplicity, it is assumed here that, during the first (positive) elaboration of the in-memory calculation operation, there is a concurrent selection of all sign word line groups WL$_{n+,-}$ in response to the fact that the input data X$_n$ are non-zero. Furthermore, for the sake of simplicity, it is assumed that the input data $x_1$ and $x_2$ are positive and that the input datum X$_N$ is negative, while the other word lines are not considered hereinafter for simplicity of description.

At time t3 the switching of the start signals START$_n$ occurs and therefore the first (positive) elaboration step of the in-memory calculation operation begins. More particularly, the concurrent activation of the word lines WL$_{1+}$, WL$_{2+}$ and WL$_{N-}$ (corresponding to the case 1 for the word lines WL$_{1+}$ and WL$_{2+}$ and to the case 2 for the word line WL$_{N-}$) occurs. Still at time t3, the value of the previously reset timer signal TM begins to increment.

At time t4, the incremental value of the timer signal TM equals the digital value of the input datum $x_1$ and therefore the pulse of the word line activation signal 21 on the positive word line WL$_{1+}$ ends.

At time t5, the incremental value of the timer signal TM equals the digital value of the input datum $x_2$ and therefore the pulse of the word line activation signal 21 on the positive word line WL$_{2+}$ ends.

At time t6, the incremental value of the timer signal TM equals the digital value of the input datum X$_N$ and therefore the pulse of the word line activation signal 21 on the negative word line WL$_{N-}$ ends.

At time t7, the start signal START$_n$ switches to the low logic value and the value of the timer signal TM is reset. Furthermore, the analog signals of the intermediate output data dy$_1$ to dy$_K$ are sampled for the analog-to-digital conversion.

At time t8, the elaboration signal ELAB$_n$ switches to logic 0 in connection with the end of the first (positive) elaboration step of the in-memory calculation operation and with the beginning of the second (negative) elaboration step of the in-memory calculation operation. For the sake of simplicity, it is assumed here that, during the second (negative)

elaboration of the in-memory calculation operation, there is a concurrent selection of all sign word line groups WL$_{n+,-}$ in response to the fact that the input data X$_n$ are non-zero.

At time t9 the switching of the start signal START$_n$ occurs and therefore the second (negative) elaboration step of the in-memory calculation operation begins. More particularly, the concurrent activation of the word lines WL$_{1-}$, WL$_{2-}$ and WL$_{N+}$ (corresponding to the case 3 for the word lines WL$_{1+}$ and WL$_{2+}$ and to the case 4 for the word line WL$_{N-}$) occurs. Still at time t3, the value of the previously reset timer signal TM begins to increment. Furthermore, at time t9 the value of the previously reset timer signal TM begins to increment.

At time t10, the incremental value of the timer signal TM equals the digital value of the input datum $x_1$ and therefore the pulse of the word line activation signal 21 on the negative word line WL$_{1-}$ ends.

At time t11, the incremental value of the timer signal TM equals the digital value of the input datum $x_2$ and therefore the pulse of the word line activation signal 21 on the negative word line WL$_{2-}$ ends.

At time t12, the incremental value of the timer signal TM equals the digital value of the input datum X$_N$ and therefore the pulse of the word line activation signal 21 on the positive word line WL$_{N+}$ ends.

At time t13, the start signal START$_n$ switches to the low logic value and the value of the timer signal TM is reset. Furthermore, the analog signals of the intermediate output data dy$_1$ to dy$_K$ are sampled for the analog-to-digital conversion.

At time t14, the elaboration signal ELAB$_n$ switches to logic 1 in connection with both the end of the second (negative) elaboration of the in-memory calculation operation and the end of the overall in-memory calculation operation.

Subsequently, there is calculated (for example by a digital processing circuit of the control circuit 31, not shown and coupled to the digital detectors 16) the difference between the digital signals of the intermediate output data dy$_1$ to dy$_K$ obtained during the first, positive, data elaboration step (hereinafter also referred to as dy$_1$' to dy$_K$') and the digital signals of the respective intermediate output data dy$_1$ to dy$_K$ obtained during the second, negative, data elaboration step (hereinafter also referred to as dy$_1$" to dy$_K$"). This difference allows to obtain, for each calculation iteration and on the basis of the respective input vector X, the respective final output vector Y=Y$_1$, . . . , Y$_K$, wherein Y$_k$=dy$_k$'-dy$_k$" is the k-th final output datum of the final output vector Y and where dy$_k$' and dy$_k$" relate to the bit line BL$_i$ selected by the selector 15$_k$.

In the example considered so far, dy$_k$' depends on the sum of the cell currents i$_{cell}$ of the memory cells 20 active in the first elaboration step (e.g., it depends on g$_{i1}$xX$_1$+g$_{i2}$x0+ g$_{i3}$xX$_2$+g$_{i2}$x0+, . . . , +g$_{i(N-1)}$x0+g$_{iN}$xX$_N$) and dy$_k$" depends on the sum of the cell currents i$_{cell}$ of the memory cells 20 active in the second elaboration step (e.g., it depends on g$_{i1}$x0+g$_{i2}$xX$_1$+g$_{i3}$x0+g$_{i2}$xX$_2$+, . . . , +g$_{i(N-1)}$xX$_N$+g$_{iN}$X0).

It is therefore possible to perform a signed calculation by acquiring, for each bit line BL$_i$, the respective bit line currents I$_{BL,i}$ along this bit line BL$_i$ in two elaboration steps consecutive to each other from a temporal point of view. In the two elaboration steps, for each sign word line group WL$_{n+,-}$, word lines WL$_{n+}$/WL$_{n-}$ which are different from each other (i.e., first the positive word line WL$_{n+}$ and then the negative word line WL$_{n-}$ or vice versa, as a function of the sign of the input datum $x_n$) are used. In this manner, the two-bit information contained in the memory groups 22 is acquired and processed.

Figure 8:
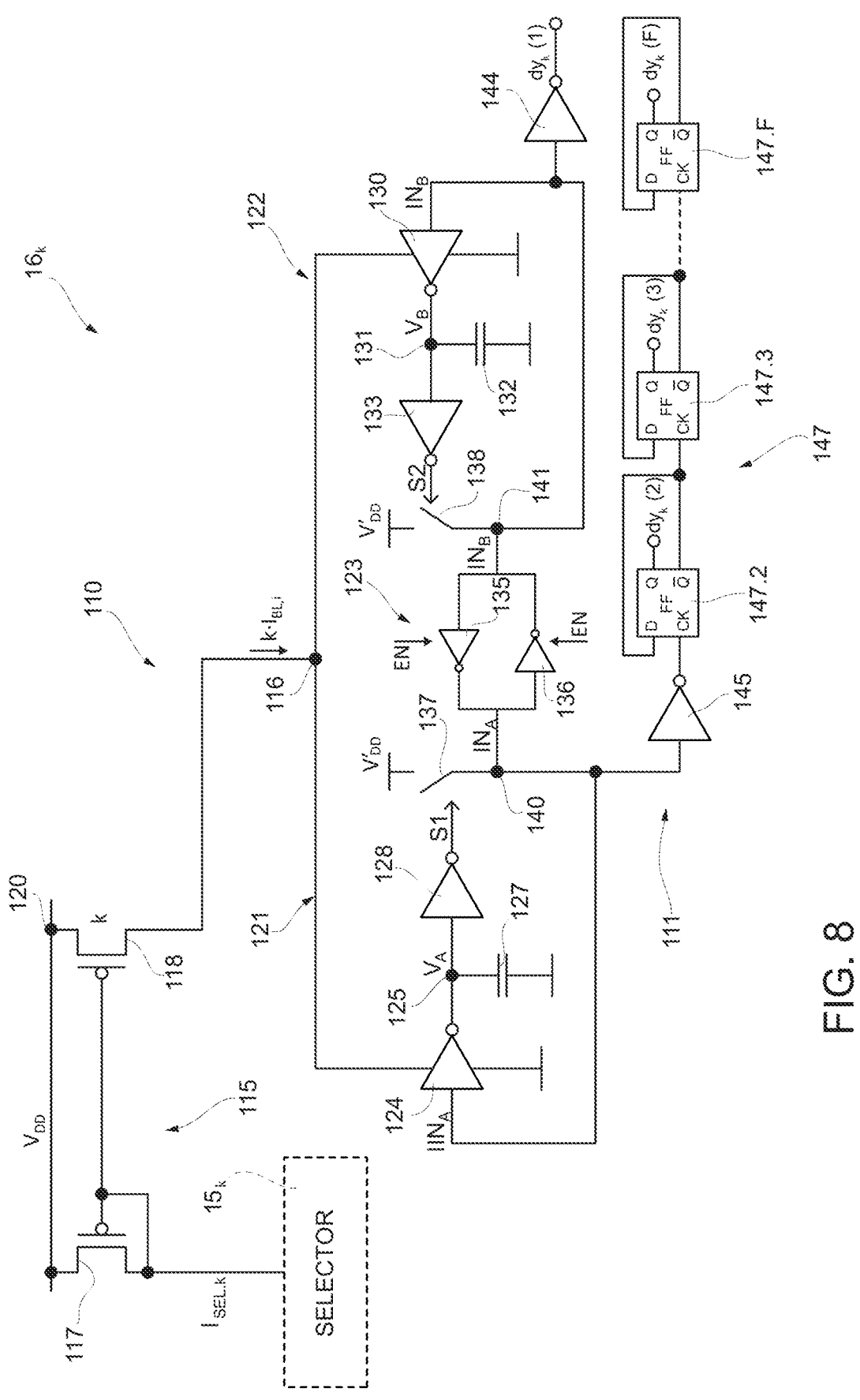

FIG. 8 shows an embodiment of the digital detectors 16. In detail, the digital detectors 16 are described below with reference to the digital detector $16_k$ coupled to the respective selector $15_k$ and therefore, through the latter, to any bit line $BL_i$ of the plurality of bit lines coupled to the selector $15_k$.

The digital detector $16_k$ comprises an integration stage 110 and a counter stage 111.

In this embodiment, the integration stage 110 comprises a current mirror 115 which mirrors the bit line current $I_{BL,i}$ of the bit line $BL_i$, connected to the digital detector $16_k$ through the selector $15_k$, in an input node 116 of the respective integration stage 111.

The current mirror 115 has a mirror ratio 1:k, so that a mirrored bit line current $k \cdot I_{BL,i}$ traverses the input node 116 of the integration stage 110.

In detail, the current mirror 115 has a first branch, here formed by a respective PMOS transistor 117, coupled to the bit line $BL_i$ through the selector $15_k$, and a second branch, formed here by a respective PMOS transistor 118, coupled to the respective integration stage 110.

The sources of the PMOS transistors 117, 118 are coupled to a supply node 120, here at the supply voltage $V_{DD}$, the gates of the PMOS transistors 117, 118 are mutually coupled to each other and to the drain of the PMOS transistor 117. The drain of the PMOS transistor 118 is coupled, in particular here is directly connected, to the input node 116 of the integration stage 110.

The integration stage 110 comprises a first integration circuit 121, a second integration circuit 122 and a switching circuit 123 coupled between the first and the second integration circuits 121, 122.

The first and the second integration circuits 121, 122 are coupled to the input node 116 so as to receive the mirrored bit line current $k \cdot I_{BL,i}$.

The first integration circuit 121 comprises a first inverter 124 having an output 125, a capacitor 127 of capacitance CA coupled to the output 125 of the first inverter 124, and a second inverter 128 whose input is coupled to the output 125 of the first inverter 124.

The first inverter 124 has a supply node coupled to the input node 116 of the integration stage 110 (FIG. 9) and receives at input a first control signal $IN_A$.

In practice, the first inverter 124 is biased by the mirrored bit line current $k \cdot I_{BL,i}$.

The capacitor 127 has a first terminal coupled to the output node 125 of the first inverter 124 and a second terminal coupled to a reference node, here to ground.

The output node 125 of the first inverter 124 is at a first integration voltage $V_A$ which drops across the capacitor 127.

The second inverter 128 has a first sampling threshold, hereinafter referred to as first threshold $V_{th1}$, receives at input the first integration voltage $V_A$ and provides at output a first switch signal S1 as a function of the first threshold $V_{th1}$ and the first integration voltage $V_A$.

In detail, the first switch signal S1 is a logic signal having a high logic value when the first integration voltage $V_A$ is lower than the first threshold $V_{th1}$, and a low logic value when the first integration voltage $V_A$ is higher than the first threshold $V_{th1}$.

The second integration circuit 122 comprises a first inverter 130 having an output 131, a capacitor 132 of capacitance CB coupled to the output 131 of the first inverter 130, and a second inverter 133 whose input is coupled to the output 131 of the first inverter 130.

The first inverter 130 has a supply node coupled to the input node 116 of the integration stage 110 (FIG. 9) and receives at input a second control signal $IN_B$.

In practice, the first inverter 130 is biased by the mirrored bit line current $k \cdot I_{BL,i}$.

The capacitor 132 has a first terminal coupled to the output node 131 of the first inverter 130 and a second terminal coupled to a reference node, here to ground.

The output node 131 of the first inverter 130 is at a second integration voltage $V_B$ which drops across the capacitor 131.

The second inverter 133 has a second sampling threshold $V_{th2}$, hereinafter referred to as second threshold $V_{th2}$, receives at input the second integration voltage $V_B$ and provides at output a second switch signal S2 as a function of the second threshold $V_{th2}$ and the second integration voltage $V_B$.

In detail, the second switch signal S2 is a logic signal having a high logic value when the second integration voltage $V_B$ is lower than the second threshold $V_{th2}$, and a low logic value when the second integration voltage $V_B$ is higher than the second threshold $V_{th2}$.

In this embodiment, the first threshold $V_{th1}$ is equal to the second threshold $V_{th2}$; however, the first threshold $V_{th1}$ may be different from the second threshold $V_{th2}$, according to the specific application.

The switching circuit 123 is a latch formed by two inverters 135, 136 arranged in a ring configuration, a first switch 137 controlled by the first switch signal S1 and a second switch 138 controlled by the second switch signal S2.

The switching circuit 123 has a first node 140 coupled to the input of the inverter 136 and to the output of the inverter 135, and a second node 141 coupled to the output of the inverter 136 and to the input of the inverter 135.

The first node 140 provides the first control signal $IN_A$. The second node 141 provides the second control signal $IN_B$.

The first switch 137 is coupled between the first node 140 and a node at a voltage V'DD, the second switch 138 is coupled between the second node 141 and the node at the voltage $V'_{DD}$.

The voltage $V'_{DD}$ may be equal to or different from the supply voltage $V_{DD}$ of the supply node 120. For example, if the voltage $V'_{DD}$ is different from, in particular lower than, the supply voltage $V_{DD}$, the digital detector 16 may comprise a voltage scaling circuit, for example a transistor, here not shown, whose source and drain terminals are coupled between the supply node 120 and the input node 116 of the integration stage 110.

In this embodiment, the switching circuit 123 also receives the enable signal EN, which controls the activation of the switching circuit 123. For example, the enable signal EN may be used to maintain the switching circuit 123 off when is not in use, thereby allowing the energy consumption to be optimized. Furthermore, the enable signal EN may be used to set the switching circuit 123 to a defined state, for example when the IMC device 10 is switched on. The charge counter stage 111 is coupled to the first and to the second nodes 140, 141 of the switching circuit 123.

In detail, the charge counter stage 111 comprises an inverter 144, whose input is coupled to the second node 141, and a counter comprising an inverter 145 whose input is coupled to the first node 140, and a plurality of D-type flip-flops 147 including a first flip-flop 147.2, a second flip-flop 147.3 and a last flip-flop 147.F, wherein F is the number of bits of the output signal $dy_k$.

In practice, the counter of the charge counter stage 111 has F−1 flip-flops 147.

The output of the inverter 144 provides the first bit $dy_k(1)$, i.e., the least significant bit, of the output signal $dy_k$.

In other words, the output of the inverter 144 may be used, at the end of a calculation performed by the IMC device 10, as the least significant bit $dy_k(1)$ of the output signal $dy_k$. The flip-flops 147 are cascaded with each other, sequentially from the first flip-flop 147.2 to the last flip-flop 147.F.

The flip-flops 147 each have a clock input (CK-input), a data input (D-input), a Q-output, and a $\overline{Q}$-output.

The CK-input of the first flip-flop 147.2 is coupled to the output of the inverter 145. The $\overline{Q}$-output of the first flip-flop 147.2 is fed back to the D-input of the first flip-flop 147.2. The Q-output of the first flip-flop 147.2 is the second bit $dy_k(2)$ of the output signal $dy_k$.

The CK-input of the second flip-flop 147.3 is coupled to the $\overline{Q}$-output of the first flip-flop 147.2. The $\overline{Q}$-output of the second flip-flop 147.3 is fed back to the D-input of the second flip-flop 147.3. The Q-output of the second flip-flop 147.3 is the third bit $dy_k(3)$ of the output signal $dy_k$.

What has been described for the second flip-flop 147.3 applies, mutatis mutandis, for all the successive flip-flops, here not shown, up to the F−1-th flip-flop, also not shown.

Finally, the CK-input of the last flip-flop 147.F is coupled to the $\overline{Q}$-output of the F−1-th flip-flop. The $\overline{Q}$-output of the last flip-flop 147.F is fed back to the D-input of the last flip-flop 147.F. The Q-output of the last flip-flop 147.F is the most significant bit $dy_k(F)$ of the output signal $dy_k$.

Figures 9, 10:
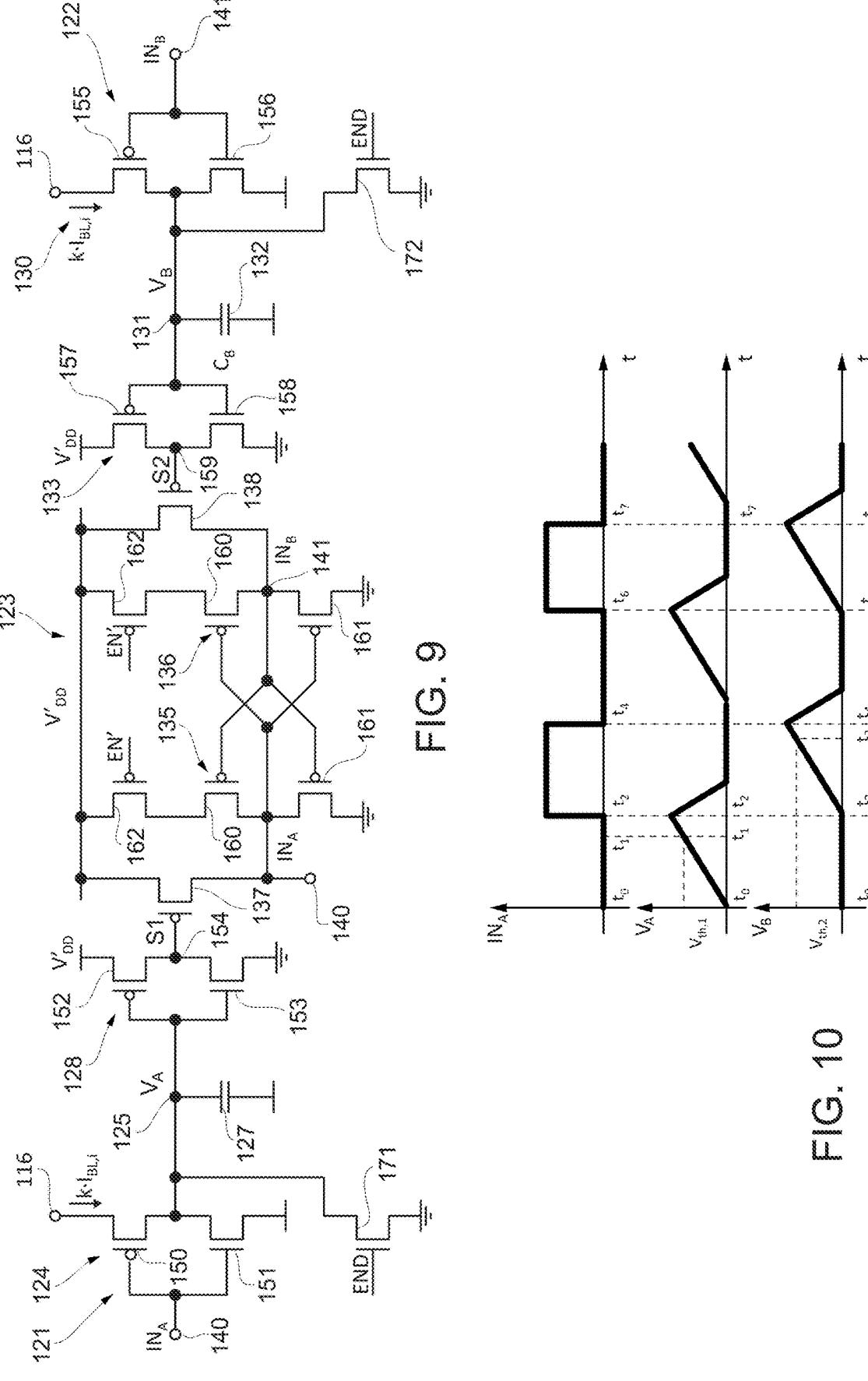

With reference to FIG. 9, the first inverter 124 of the first integration circuit 121 is a CMOS inverter formed by the series circuit of a PMOS transistor 150 and a NMOS transistor 151, mutually coupled to the output node 125. The PMOS and NMOS transistors 150, 151 receive the first control signal $IN_A$ at the respective gate terminals.

The source of the PMOS transistor 150 is coupled to the input node 116 of the integration stage 110.

The second inverter 128 of the first integration circuit 121 is a CMOS inverter formed by the series circuit of a PMOS transistor 152 and a NMOS transistor 153, mutually coupled to a node 154 providing the first switch signal S1.

The first threshold $V_{th1}$ of the second inverter 128 is the switching threshold of the second inverter 128, and therefore depends on the properties, for example on the threshold or on-state resistance, of the PMOS and NMOS transistors 152, 153. In practice, the switching threshold may be the input voltage for which the output of the inverter has a high logic value or the input voltage for which the output of the inverter has a low logic value.

For example, the switching threshold of the second inverter 128 may be defined as the operating point at which the respective input voltage, i.e., the first integration voltage $V_A$, is equal to the respective output voltage, i.e., the first switch signal S1.

The first inverter 130 of the second integration circuit 122 is a CMOS inverter formed by the series circuit of a PMOS transistor 155 and a NMOS transistor 156, mutually coupled to the output node 131. The PMOS and NMOS transistors 155, 156 receive the second control signal $IN_B$ at the respective gate terminals.

The source of the PMOS transistor 155 is coupled to the input node 116 of the integration stage 110.

The second inverter 133 of the second integration circuit 122 is a CMOS inverter formed by the series circuit of a PMOS transistor 157 and a NMOS transistor 158, mutually coupled to a node 159 providing the second switch signal S2.

The second threshold $V_{th2}$ of the second inverter 133 is the switching threshold of the second inverter 133, i.e., it depends on the properties of the PMOS and NMOS transistors 157, 158. For example, the switching threshold depends on the gate-source voltage which allows a current to flow through the source-drain path of the PMOS and NMOS transistors 157, 158.

As shown in the detailed implementation of FIG. 9, the first and the second inverters 135, 136 of the switching circuit 123 are cross-coupled CMOS inverters each comprising a respective PMOS transistor 160 and a respective NMOS transistor 161 mutually coupled in series between a supply node, here at the voltage $V'_{DD}$, and ground.

Furthermore, the first and the second inverters 135, 136 of the switching circuit 123 each also comprise a respective enable switch, here a PMOS transistor 162, which is coupled between the supply node at the voltage $V'_{DD}$ and the PMOS transistor 160 of the respective inverter.

The PMOS transistors 162 are controlled by the enable signal EN.

In use, the bit line current $I_{BL,i}$ of the bit line $BL_i$ coupled to the digital detector $16_k$ through the selector $15_k$ is mirrored in the integration stage 110 of the respective digital detector $16_k$.

FIG. 10 shows an example of the trend over time of the first control signal $IN_A$, of the first integration voltage $V_A$ and of the second integration voltage $V_B$ of the digital detector 16 of FIG. 8.

For $t_0 < t < t_1$, the first integration voltage $V_A$ is lower than the first threshold $V_{th,1}$. Consequently, the PMOS transistor 152 of the second inverter 128 is on and the NMOS transistor 153 of the second inverter 128 is off. Therefore, the first switch signal S1 (here not shown) has a high value and the first switch 137 is open. The first control signal $IN_A$ has a low value.

As a result, with reference to the first inverter 124 of the first integration circuit 121, for $t_0 < t < t_1$, the PMOS transistor 150 is on and the NMOS transistor 151 is off.

At the same time, for $t_0 < t < t_1$, the second control signal $IN_B$ has the high value. Therefore, with reference to the first inverter 130 of the second integration circuit 122, for $t_0 < t < t1$, the PMOS transistor 155 is off and the NMOS transistor 156 is on.

Consequently, the mirrored bit line current $k \cdot I_{BL,i}$ flows, from the input node 116, only through the first inverter 124 of the first integration circuit 121 and not through the first inverter 130 of the second integration circuit 122.

In detail, the mirrored bit line current $k \cdot I_{BL,i}$ flows through the PMOS transistor 150 and charges the capacitor 127. The first integration voltage $V_A$ thus increases over time for $t_0 < t < t_1$.

In detail, in the example of FIG. 10, the first integration voltage $V_A$ increases linearly over time for $t_0 < t < t_1$; however, the trend of the first integration voltage $V_A$ depends on the specific trend of the bit line current $I_{BL,i}$ in the time interval $t_0 < t < t_1$.

When the first integration voltage $V_A$ becomes equal to the first threshold voltage $V_{th,1}$, the NMOS transistor 153 of the second inverter 128 switches on and the PMOS transistor 152 switches off.

In this embodiment, the first control signal $IN_A$ assumes a high value in a time instant $t_2$.

The time delay between the times $t_1$ and $t_2$ may correspond, for example, to the propagation delay of the second inverter 128 of the first integration circuit 121 and/or to the switching time of the first switch 137.

For $t_1 < t < t_2$, the mirrored bit line current $I_{BL,i}$ continues to charge the capacitor 127; consequently, the first integration voltage $V_A$ increases up to a maximum value (time $t_2$).

At time instant $t_2$, when the first control signal $IN_A$ assumes a high value, the second control signal $IN_B$ (here not shown) assumes a low value (the inverter 136 of the switching circuit 123 receives at input the first control signal $IN_A$).

While the first control signal $IN_A$ has a high value, the PMOS transistor 150 and the NMOS transistor 151 of the first inverter 124 of the first integration circuit 121 are, respectively, off and on. At the same time, while the second control signal $IN_B$ has a low value, the PMOS transistor 155 and the NMOS transistor 156 of the first inverter 130 of the second integration circuit 122 are, respectively, on and off.

Therefore, for $t>t_2$, the mirrored bit line current $k \cdot I_{BL,i}$ flows, from the input node 116, only through the first inverter 130 of the second integration circuit 122 and not through the first inverter 124 of the first integration circuit 121.

In detail, the mirrored bit line current $k \cdot I_{BL,i}$ flows through the PMOS transistor 155 and charges the capacitor 132 of the second integration circuit 122. The second integration voltage $V_B$ thus increases over time from time instant $t_2$.

In detail, in the example of FIG. 10, the second integration voltage $V_B$ increases linearly over time for $t>t_2$; however, the trend of the second integration voltage $V_B$ depends on the specific trend of the bit line current $I_{BL,i}$.

While the first control signal $IN_A$ has a high value, the capacitor 127 of the first integration circuit 121 discharges through the NMOS transistor 151 of the first inverter 124.

The first integration voltage $V_A$ thus decreases to zero.

When the second integration voltage $V_B$ becomes equal to the second threshold voltage $V_{th,2}$ (time instant $t_3$), the NMOS transistor 158 of the second inverter 133 switches on and the PMOS transistor 157 switches off.

Consequently, at a time instant t4, the second control signal $IN_B$ assumes a high value, similarly to what has been discussed above for the first control signal $IN_A$ at time instant $t_2$.

In detail, in response to the second integration voltage $V_B$ reaching the second threshold $V_{th,2}$, the second switch signal S2 switches to the low value and the second switch 138 closes, so that the second node 141 is at the voltage $V'_{DD}$ and, consequently, the second control signal $IN_B$ assumes a high value.

The time delay between the times $t_3$ and $t_4$ may correspond, for example, to the propagation delay of the second inverter 133 of the second integration circuit 122 and/or to the switching time of the second switch 138.

For $t_3<t<t_4$, the mirrored bit line current $k \cdot I_{BL,i}$ continues to charge the capacitor 132 of the second integration circuit 122; consequently, the second integration voltage $V_B$ increases up to a maximum value (time $t_4$).

For $t_2<t<t_4$, the switching circuit 123 maintains the first control signal $IN_A$ to the high value and the second control signal $IN_B$ to the low value.

At time instant $t_4$, the first control signal $IN_A$ assumes again a low value, in response to the second control signal $IN_B$ assuming the high value.

In response to the first control signal $IN_A$ assuming the low value, the mirrored bit line current $k \cdot I_{BL,i}$ returns to charge the capacitor 127 of the first integration circuit 121 up to a time instant to, similarly to what has been discussed for $t_1<t<t_2$.

Consequently, from time instant $t_6$ to time instant $t_7$, the mirrored bit line current $k \cdot I_{BL,i}$ charges the capacitor 132 of the second integration circuit 122 up to a time instant $t_7$, similarly to what has been discussed for $t_2<<t_4$.

Again, with reference to FIG. 8, the counter stage 111, in particular the flip-flops 147, counts the number of switching events of the first control signal $IN_A$, in particular in this embodiment it counts the number of rising edges of the first control signal $IN_A$.

In practice, the digital detectors 16 each measure the bit line current $I_{BL,i}$ of the respective bit line $BL_i$ connected thereto through the respective selector $15_k$, performing a number of successive sampling iterations. In each sampling iteration, for example with reference to a sampling iteration wherein the mirrored bit line current $k \cdot I_{BL,i}$ flows through the first integration circuit 121, the integration stage 110 generates the first integration voltage $V_A$ as the time integral of the mirrored bit line current $k \cdot I_{BL,i}$, compares the first integration voltage $V_A$ with the first threshold $V_{th,1}$ and, in response to the first integration voltage $V_A$ reaching the first threshold $V_{th,1}$, resets the first integration voltage $V_A$, in particular here by switching the first control signal $IN_A$. The counter stage 110 updates the respective output signal $y_i$ in response to the first integration voltage $V_A$ reaching the first threshold $V_{th,1}$.

In this embodiment, the least significant bit of the output signal $dy_k$ is the value of the second control signal $IN_B$ at the end of the computation performed by the IMC device 10.

In other words, the digital detectors 16 each sample the respective bit line current $I_{BL,i}$ by converting the bit line current $I_{BL,i}$ into a number of charge packets and counting said charge packets, wherein each charge packet corresponds to the charge accumulated on the capacitors 127, 132 which causes a switching of the second inverters 128, 133.

As a result, the capacitors 127, 132 may have a reduced capacitance if compared with a case in which the bit line current is integrated all at once on a single capacitor of capacitance $C_{tot}$. In detail, the capacitance of the capacitors 127, 132 may be lower than the capacitance $C_{tot}$ by a factor 2F, wherein F is the number of bits of the output signal $dy_k$.

Therefore, the digital detectors 16 may have a small chip area occupation and, consequently, the IMC device 10 may have low manufacturing costs.

Furthermore, the digital detectors 16 each begin to discretize the respective bit line current $I_{BL,i}$ as the bit line current $I_{BL,i}$ traverses the respective bit line $BL_i$. Therefore, the output signal $dy_k$ may be ready immediately after the end of a computation performed by the IMC device 10 or immediately after the stop of the respective bit line current $I_{BL,i}$.

For example, according to one embodiment, the digital detectors 16 may each sample the respective bit line current $I_{BL,i}$ until the digital detectors 16 receive a stopping signal, for example from a user of the IMC device 10 or from the word line activation circuit 14, indicating the end of the computation performed by the IMC device 10.

Therefore, the digital detectors 16 may have a fast measurement time, thereby allowing the IMC device 10 to have a low computation time.

Furthermore, according to the illustrated embodiment, the switching circuit 123 disables the first integration circuit 121 and enables the second integration circuit 122, in response to the first integration signal $V_A$ reaching the first threshold $V_{th,1}$, and enables the first integration circuit 121 and disables the second integration circuit 122, in response to the second integration signal $V_B$ reaching the second threshold $V_{th,2}$.

This allows the bit line current $I_{BL,i}$ to be alternately sampled by the first integration circuit 121 and the second integration circuit 122, thereby allowing the bit line current $I_{BL,i}$ to charge the capacitor 127 while the capacitor 132 is discharging and to charge the capacitor 132 while the capacitor 127 is discharging. By doing so, no charge may be lost during sampling and the digital detector 16 may reach a high measurement accuracy of the bit line current $I_{BL,i}$.

Again with reference to FIG. 9, the integration stage 110 may further comprise a first and a second stopping switch, here a first and a second NMOS transistor 171, 172, which prevent the respective digital detector 16$_k$ from sampling the respective bit line current $I_{BL,i}$.

In detail, the first and the second NMOS transistors 171, 172 have a drain terminal coupled to the output nodes 127, 131 of the first and, respectively, the second integration circuits 121, 122; and a source terminal coupled to a reference potential line, here ground. The first and the second NMOS transistors 171, 172 receive, at the respective gate terminals, the end-of-count signal END generated by the end-of-computation comparator 170.

When the timer signal TM<L:1> becomes equal to the maximum count signal MAX_CNT<L:1>, the end-of-computation comparator 170 switches the end signal END to the high logic value, thereby switching on the first and the second NMOS transistors 171, 172 and short-circuiting to ground the output nodes 127, 131 of the first and the second integration circuits 121, 122.

Consequently, the first and the second integration circuits 121, 122 stop integrating the bit line current $BL_i$.

In practice, the end-of-count signal END may be used to determine the end of the MAC calculation by the IMC device 10.

As determinable from what has been previously described as regards the timer 45 of FIG. 3 and the digital detector 16$_k$ of FIG. 8, the circuit structures of the timer 45 and the digital detector 16$_k$ have some advantages.

For example, the first threshold $V'_{th1}$ of the second inverter 200 of the timer 45 is equal to the first threshold $V_{th1}$ of the second inverter 128 of the digital detectors 16. The second threshold $V'_{th2}$ of the second inverter 205 of the timer 45 is equal to the second threshold $V_{th2}$ of the second inverter 133 of the digital detectors 16.

Furthermore, according to one embodiment, the voltage $V'_{DD}$ of the count portion 181 of the timer 45 may be equal to the voltage $V'_{DD}$ of the integration stage 110 of the digital detector 16$_k$. In practice, the timer 45, in particular the respective integration stage 190, has a circuit diagram equal to the circuit diagram of any of the digital detectors 16, in particular of the respective integration stage 110. As a result, the timer 45 generates the timer signal TM<L:1> from the oscillator current $I_{OSC}$ in the same manner as any of the digital detectors 16 generates the output datum $dy_k$ from the respective bit line current $I_{BL,i}$.

In use, the fact that the timer 45 generates the timer signal TM<L:1> from the oscillator current $I_{OSC}$ in the same manner as the digital detectors 16 each generate the respective output datum $dy_k$ from the respective bit line current $I_{BL,i}$, in particular the fact that the respective integration circuits 110, 181 have the same circuit diagram, allows a strong correlation between the timer signal TM<L:1> and the output data $dy_1, \ldots, dy_k$ to be obtained. Therefore, global variations that may affect the IMC device 10, such as for example drifts of the supply voltages $V_{DD}$, $V'_{DD}$ and/or temperature variations, are compensated by the timer 45 and by the digital detectors 16, without thereby affecting the accuracy of the MAC operation performed by the IMC device 10.

By varying the oscillator current $I_{OSC}$, for example by varying the reference current $I_{REF}$ through the external signal EXT, the update frequency $f_u$ of the timer signal TM<L:1> and, therefore, the total computation time of the IMC device 10, may be modified. In fact, for example, an increase in the oscillator current $I_{OSC}$ implies that the oscillator integration voltages $V'_A$, $V'_B$ increase more quickly; as a result, the first and the second oscillator control signals $OS_A$, $OS_B$ switch more quickly, thereby also increasing the update frequency $f_u$ of the timer signal TM<L:1>.

FIG. 11 shows an embodiment of the IMC device 10. In particular, FIG. 11 shows the memory array 12, the selectors 15 and the digital detectors 16; the remaining elements of the IMC device 10 are not shown here for ease of view but are nonetheless present as previously described.

As previously described, the memory array 12 has M×N' memory cells 20 grouped into M×N memory groups 22, with N'=2N.

In FIG. 11 K MAC assemblies 24 are present, in particular arranged laterally to each other and aligned so as to share the word lines $WL_{1+}, \ldots, WL_{N-}$.

In FIG. 11, each MAC assembly 24$_k$ has R×N memory groups 22 and R×N' memory cells 20, where R is an integer and, purely by way of non-limiting example, R=8 (indeed other values of R may be used, for example R=3 or R=30). The memory cells 20 are connected to the bit lines BL and to the word lines WL as previously described. Consequently, each MAC assembly 24$_k$ has a quantity R of columns of memory groups 22 and the same quantity R of bit lines BL. Furthermore, it is considered that M is a multiple of R and in particular that it is M=K·R.

In general, the number R of columns (i.e., of bit lines BL) of each MAC assembly 24$_k$ coincides with a maximum number of layers of the neural network to be implemented through the IMC device 10. In particular, each row (and therefore each bit line BL) of the MAC assembly 24$_k$ corresponds to a respective layer of the NN. In this manner, the final output data Y obtained by processing, in the calculation iteration considered and substantially concurrently with each other, the respective r-th columns of the MAC assemblies 24 (with r=1, . . . , R) form the final output vector Y which is calculated starting from the input vector X through the r-th layer of the NN.

Furthermore, the number N of sign word line groups $WL_{n+,-}$ corresponds to the maximum number $N_x$ of input data $x_1, \ldots, X_N$ which may be processed in a single calculation iteration by the IMC device 10 (i.e., it corresponds to the maximum possible length of the input vector X), and the number K of MAC assemblies 24 corresponds to the maximum number $N_y$ of final output data $y_1, \ldots, y_K$ which may be processed in a single calculation iteration by the IMC device 10. In the embodiment of FIG. 11, N=$N_x$ and K=$N_y$.

In general, K≥$N_x$.

When K=$N_x$ (e.g., FIG. 11), at the respective calculation iteration the input vector X is processed by each MAC assembly 24 in parallel to provide substantially concurrently the respective final output data $y_1, \ldots, y_k$ corresponding to the considered layer of the NN, which form the final output vector Y. In other words, in this case all MAC assemblies 24 are concurrently active to generate the final output vector Y.

Instead, when K>$N_x$ (e.g., FIGS. 13 and 14), at each calculation iteration, a part of the MAC assemblies 24 is active and contributes to the calculation of the final output vector Y while a remaining part of the MAC assemblies 24 is deactivated and does not contribute to the calculation of the final output vector Y.

For example, the exemplary case wherein K=P·$N_x$ where P is an integer (e.g., P=3) may be considered. In the exemplary case wherein P=3, only one third of the MAC assemblies 24 are concurrently active to generate the final output vector Y at one calculation iteration and the remaining MAC assemblies 24 are deactivated in this calculation iteration and may be activated in calculation iterations different from that considered.

This allows the overall calculation capabilities of the IMC device 10 to be increased by a factor equal to P without the need to update the computational weights stored in the memory array 12 each time. For example, this may substantially allow the IMC device 10 to overall implement P different neural networks before having to update the computational weights through the interface circuits 30; this occurs using only the part of MAC assemblies 24, and therefore the NN, of interest at that moment.

In case only a part of the MAC assemblies 24 contributes to generating the final output vector Y, the remaining MAC assemblies 24 may be inhibited through the respective selectors 15. In particular, the selectors 15 of the MAC assemblies 24 active at a calculation iteration considered receive the respective selection signals SEL with respective indicative values of the bit lines BL to be selected, while the selectors 15 of the MAC assemblies 24 deactivated at the calculation iteration considered receive the respective selection signals SEL which each assume an inhibition value such as not to select any bit line BL and therefore to prevent the electrical communication of the respective digital detectors 16 with the bit lines BL.

Figure 12:
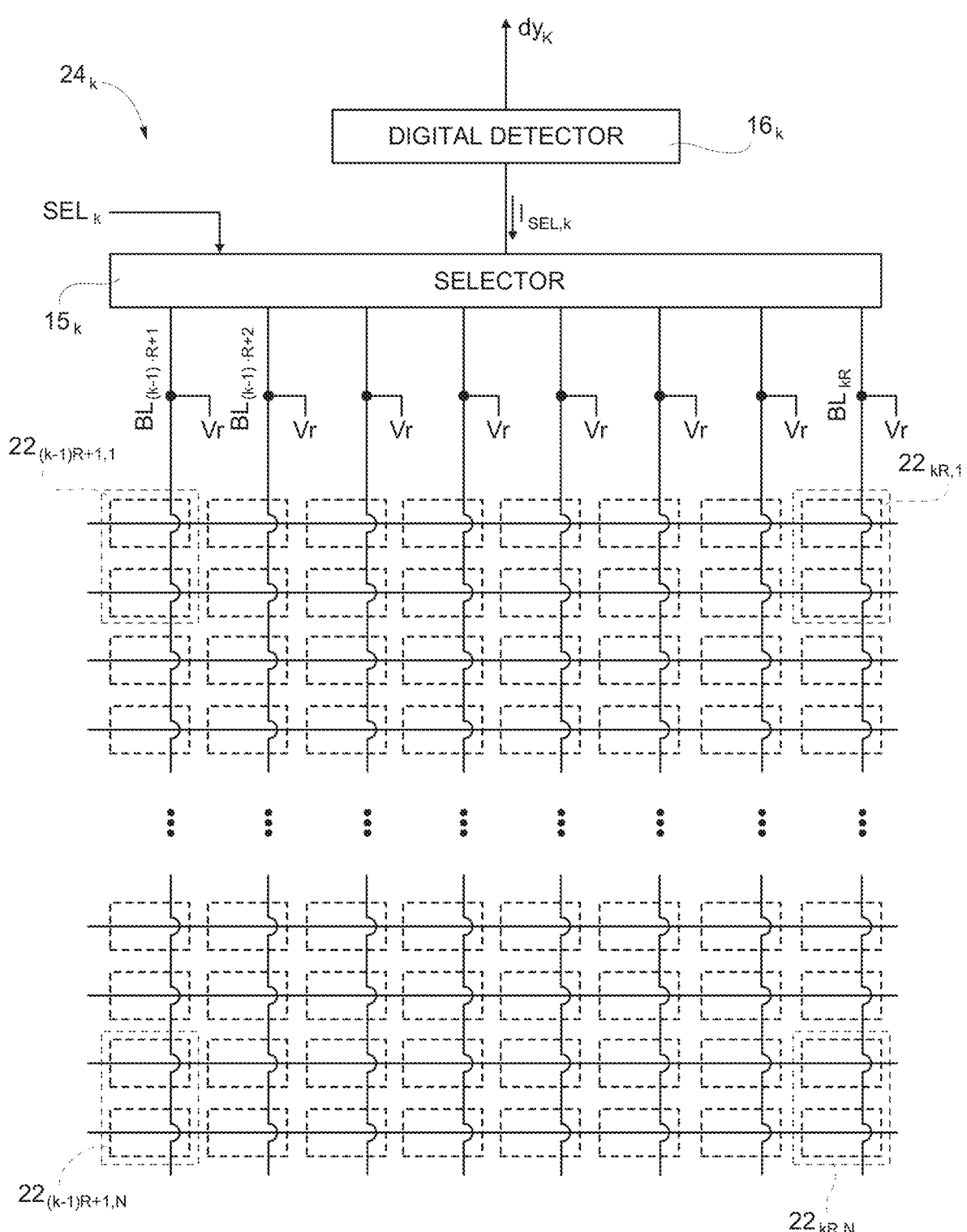

FIG. 12 shows an example of the MAC assembly $24_k$, with k=1, . . . , K.

In particular, the MAC assembly $24_k$ comprises the memory groups $22_{(k-1)R+1,1}$ to $22_{kR \cdot N}$, connected to the bit lines $BL_{(k-1)R+1}$ to $BL_{kR}$. The bit lines $BL_{(k-1)R+1}$ to $BL_{kR}$ are connected to the selector $15_k$ which in turn is coupled to the digital detector 16. Each of the bit lines $BL_{(k-1) R+1}$ to $BL_{kR}$ corresponds to a respective layer of the NN.

The selector $15_k$ is an R:1-type multiplexer controlled by the selection signal $SEL_k$ arriving at a control input of the selector $15_k$. In particular, each of the R inputs of the selector $15_k$ is connected to a respective bit line of the bit lines $BL_{(k-1)R+1}$ to $BL_{kR}$ while the output is connected to the digital detector $16_k$.

The selector $15_k$ receives the selection signal $SEL_k$ whose value determines which of the bit lines $BL_{(k-1)R+1}$ to $BL_{kR}$ is electrically coupled to the digital detector $16_k$. Consequently, the digital detector $16_k$ receives the current $I_{SEL,K}$ from the bit line BL selected among the bit lines $BL_{(k-1)R+1}$ to $BL_{kR}$ as a function of the selection signal $SEL_k$. For example, the selection signal $SEL_k$ is an R-bit digital signal which has all logic 0s except for a logic 1 in a position which is indicative of the bit line BL, and therefore of the layer of the NN, to be selected (e.g., $SEL_k$='01000000' selects the second bit line $BL_{(k-1)R+2}$ and $SEL_k$='00000001' selects the last bit line $BL_{kR}$).

If instead the selection signal SEL: assumes the inhibition value (of predefined type and for example having R bits all set to 0, i.e., '00000000'), the selector $15_k$ electrically decouples the digital detector 16% from the bit lines $BL_{(k-1)R+1}$ to $BL_{kR}$ in such a way that the digital detector $16_k$ does not receive any current $I_{SEL,K}$.

When the digital detector 16 is electrically coupled to one of the bit lines $BL_{(k-1)R+1}$ to $BL_{kR}$, it samples the current $I_{SEL,K}$ to generate the intermediate output datum $dy_k$ in the manner previously described.

The operation of the IMC device 10 is now described, with reference again to FIG. 11.

Upon receiving a first input vector $X_A$, a first calculation iteration of the IMC device 10 begins and the word line activation circuit 14 converts the first input vector $X_A$ into word line activation signals 21 for the sign word line groups $WL_{n+,-}$, as previously described. These word line activation signals 21 are then provided to the sign word line groups $WL_{n+,-}$, as previously described.

The selectors 15 receive the selection signal SEL which is indicative of the selection of the first bit line $BL_{(k-1)R+1}$ of each MAC assembly $24_k$, corresponding to the first layer of the NN formed by the IMC device 10. For example, the selection signals SEL are equal to '10000000'. Consequently, the selectors 15 electrically connect the respective digital detectors 16 with the respective first bit lines $BL_{(k-1)R+1}$ of the MAC assemblies 24, throughout the duration of the first calculation iteration.

Each digital detector $16_k$ samples the current $I_{SEL,k}$ flowing through the first bit line $BL_{(k-1) R+1}$ of the respective MAC assembly $24_k$. This is done both during the first elaboration step to determine the respective intermediate output datum $dy_k'$, and during the second elaboration step to determine the respective intermediate output datum $dy_k''$, as previously described. This allows, at the end of the first calculation iteration and substantially concurrently for all MAC assemblies 24, to generate by each MAC assembly 24; the respective final output datum $Y_k$ on the basis of the intermediate output datum $dy_k'$ of the first elaboration step and of the intermediate output datum $dy_k''$ of the second elaboration step. Consequently, at the end of the first calculation iteration a first final output vector $Y_A$ is generated.

Subsequently, a second input vector $X_B$ is received and a second calculation iteration of the IMC device 10 begins. In particular, the second input vector $X_B$ may coincide with, or in any case be dependent on, the first final output vector $Y_A$.

In the second calculation iteration of the IMC device 10, the word line activation circuit 14 provides to the sign word line groups $WL_{n+,-}$ the respective word line activation signals 21, generated on the basis of the second input vector $X_B$.

Furthermore, the selectors 15 receive the selection signal SEL which is indicative of the selection of the second bit line $BL_{(k-1)R+2}$ of each MAC assembly $24_k$, corresponding to the second layer of the NN formed by the IMC device 10. For example, the selection signals SEL are equal to '01000000'. Consequently, the selectors 15 electrically connect the respective digital detectors 16 with the respective second bit lines $BL_{(k-1)R+2}$ of the MAC assemblies 24, throughout the duration of the second calculation iteration.

Each digital detector 16 therefore samples the current $I_{SEL,k}$ flowing through the second bit line $BL_{(k-1)R+2}$ of the respective MAC assembly $24_k$ in both elaboration steps, thus allowing a second final output vector $Y_B$ to be generated in a similar manner to what has been previously described.

In a similar manner, other calculation iterations are performed (one for each bit line BL of the MAC assemblies 24) up to arriving at the generation of the R-th final output vector Y which corresponds to the final result of the processing through the NN considered.

In particular, in case the final output vector Y of a layer is used as input vector X of the successive layer, a concatenation of layers of the NN may be formed. In this manner, given an input vector X, the corresponding final output vector Y obtained through the processing with this NN may be obtained.

Figure 13:
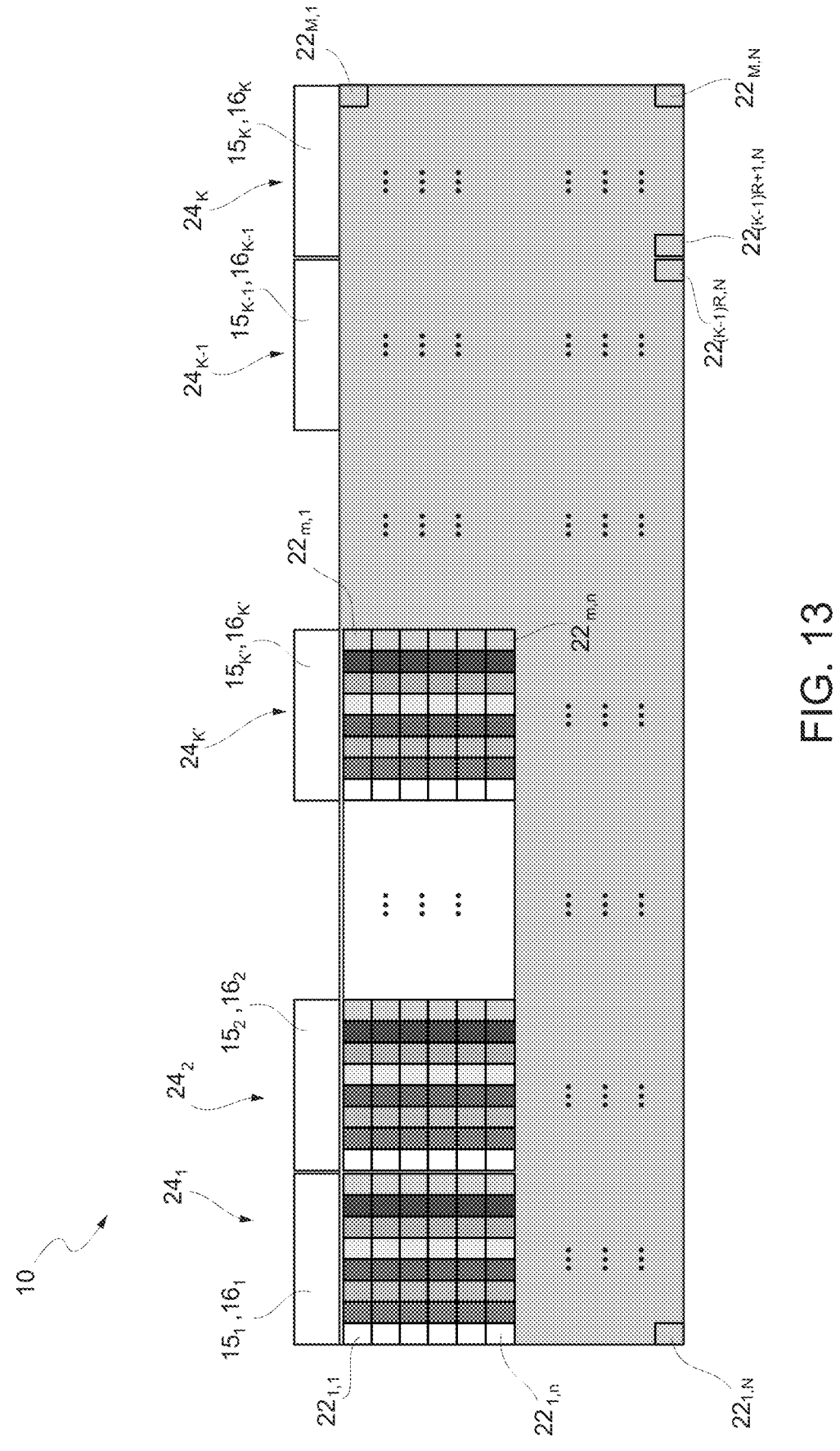

FIG. 13 shows, in a manner similar to FIG. 11, the IMC device 10 in case only a part of the MAC assemblies 24 is active in the implementation of the NN (and therefore in the calculation iterations considered) and only a part of the sign word line groups $WL_{n+,-}$ is required to generate the output vector Y.

In this exemplary case, the number $N_x$ of input data of the input vector X is lower than the number N of sign word line groups $WL_{n+,-}$ available in the IMC device 10. Consequently, the address signal ADR allows to select only the sign word line groups $WL_{1+,-}$ to $WL_{n+,-}$ to be enabled (with $n=N_x<N$ here), i.e., a sign word line group for each input datum of the input vector X. The remaining sign word line groups $WL_{n+,-}$ to $WL_{N+,-}$ are disabled through the address signal ADR, as previously described.

Furthermore, in this exemplary case, the number $N_y$ of intermediate output data $dy_k$ is lower than the number K of MAC assemblies 24 available in the IMC device 10. Consequently, the selection signals SEL allow only the MAC assemblies $24_1$ to $24_K$ (with $K'=N_y<K$ here) to be enabled, while disabling the remaining MAC assemblies $24_{K'+1}$ to $24_K$ as previously described.

In this manner, only the memory groups $22_{1,1}$ to $22_{m,n}$ (with m<M and n<N here) are enabled and functioning at the calculation iteration considered.

Figure 14:
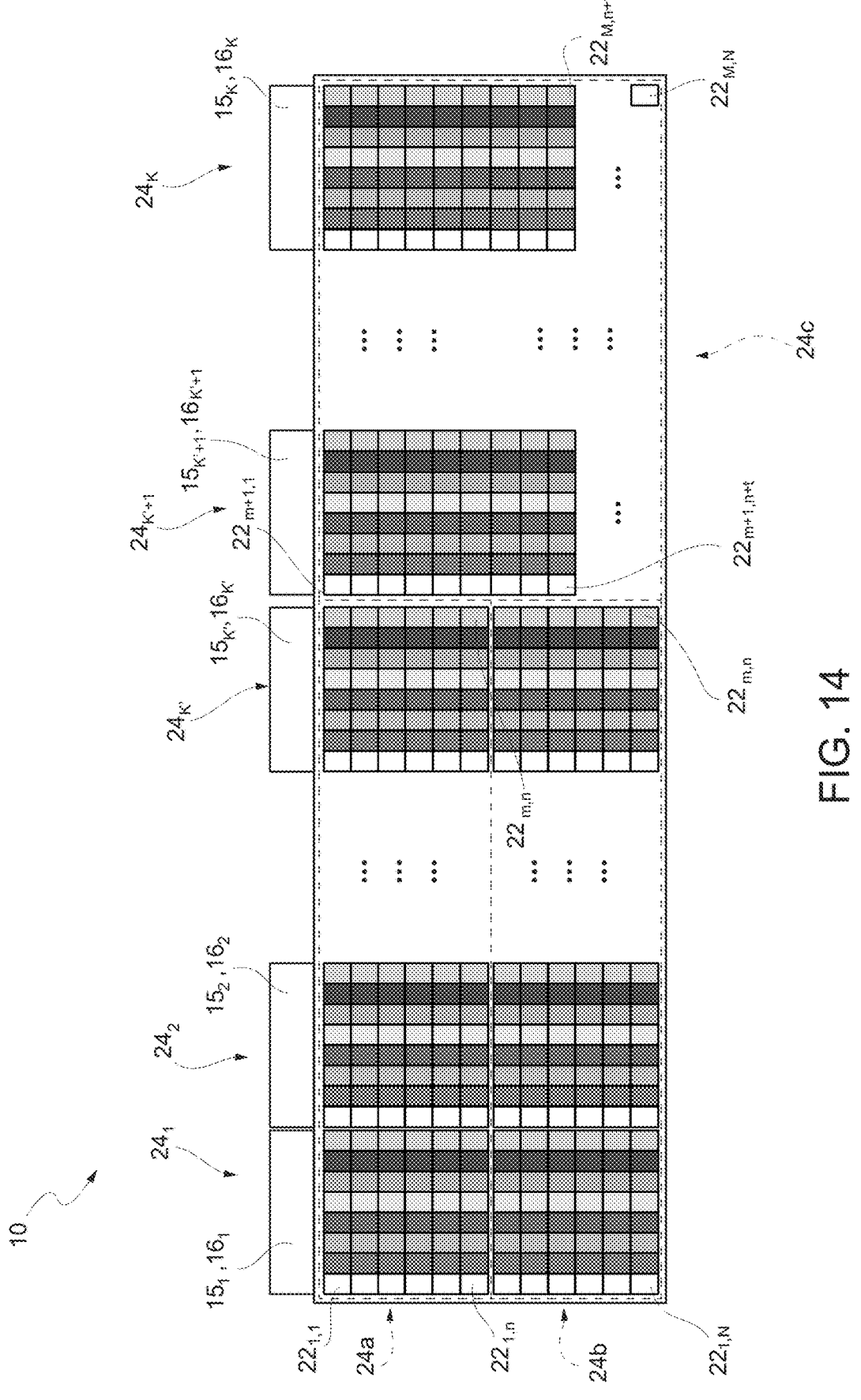

FIG. 14 shows, in a manner similar to FIG. 11, the IMC device 10 in case it is capable of implementing more than one NN without the need to update the computational weights of the memory cells 20. In particular, each NN is implemented through a respective set of MAC assemblies 24 and, in particular, through a respective set of memory groups 22. In other words, the IMC device 10 of FIG. 14 comprises a plurality of MAC circuits 24 which allow a respective plurality of NNs to be implemented.

In this exemplary case, the IMC device 10 comprises three sets of MAC assemblies 24 (hereinafter also referred to as MAC circuits) and is therefore capable of implementing, at different times, three NNs. Nevertheless, it is clear that the number of MAC circuits 24 may vary and be, for example, equal to 2 or greater than 3.

In particular and purely for exemplary and non-limiting purposes, the IMC device 10 comprises: a first MAC circuit 24a which comprises the MAC assemblies $24_1$ to $24_K$ (with K'<K here, corresponding to the bit lines $BL_1$ to $BL_m$ with m<M here) with sign word line groups $WL_{1+,-}$ to $WL_{n+,-}$ (with n<N here); a second MAC circuit 24b which comprises the MAC assemblies $24_1$ to $24_K$ with sign word line groups $WL_{(n+1)+,-}$ to $WL_{N+,-}$; and a third MAC circuit 24c which comprises the MAC assemblies $24_{K'+1}$ to $24_K$ (corresponding to the bit lines $BL_{m+1}$ to $BL_M$) with the sign word line groups $WL_{1+,-}$ to $WL_{(n+1)+,-}$ (with n+t<N here). Nonetheless, it is clear that the mutual arrangement of the MAC circuits and their matrix dimensions may vary with respect to what has been described herein.

In this exemplary case, the number n of sign word line groups $WL_{n+,-}$ corresponds to the maximum number $N_x$ of input data which may be processed in a single calculation iteration by the first MAC circuit 24a, the number N-n of sign word line groups $WL_{n+,-}$ corresponds to the maximum number $N_x$ of input data which may be processed in a single calculation iteration by the second MAC circuit 24b and the number n+t of sign word line groups $WL_{n+,-}$ corresponds to the maximum number $N_x$ of input data which may be processed in a single calculation iteration by the third MAC circuit 24c. The input vectors X may have different dimensions for the various MAC circuits, therefore the respective maximum numbers $N_x$ may be different. Furthermore, the number K' of MAC assemblies 24 corresponds to the maximum number $N_y$ of final output data which may be processed in a single calculation iteration by the first and the second MAC circuits 24a and 24b, and the number K−K' of MAC assemblies 24 corresponds to the maximum number $N_y$ of final output data which may be processed in a single calculation iteration by the third MAC circuit 24c.

The MAC circuits 24a-24c are used at times different from each other, i.e., they do not function concurrently. In fact, the MAC circuits 24a-24c share some elements of the IMC device 10 (e.g., the selectors 15 and the digital detectors 16 in the case of the first and the second MAC circuits 24a and 24b, or the word lines WL in the case of the third MAC circuit 24c as regards the first and the second MAC circuits 24a and 24b), therefore concurrent elaboration of multiple MAC assemblies is not possible.

For example, the first MAC circuit 24a may be initially used to process a first input vector $X_A'$ through a first NN defined by the computational weights stored in the memory groups $22_{1,1}$ to $22_{m,n}$, then the second MAC circuit 24b may be used to elaborate a second input vector $X_B'$ through a second NN defined by the computational weights stored in the memory groups $22_{1,n+1}$ to $22_{m,N}$, and subsequently the third MAC circuit 24c may be used to elaborate a third input vector $X_C'$ through a third NN defined by the computational weights stored in the memory groups $22_{m+1,1}$ to $22_{M,n+t}$.

By suitably designing the numbers of the sign word line groups and of the bit lines of the various MAC circuits, they may also be concatenated in such a way that the final output vector generated by one of them becomes the input vector for the successive one. In this manner a concatenation of multiple NNs may be formed.

Both in the case of FIG. 13 and of FIG. 14, the example of the MAC assembly $24_k$ of FIG. 12 is similarly valid and applicable, as well as the description of operation previously presented for a single MAC assembly (FIG. 11).

From an examination of the characteristics of the invention made according to the present invention, the advantages that it affords are evident.

The IMC device 10 allows the MAC calculation power to be increased without correspondingly increasing its complexity, power consumption and overall cost.

In fact, each digital detector 16 is associated with multiple bit lines BL through the respective selector 15. Since the area consumption and the overall cost of the IMC device 10 are generally mainly affected by the digital detectors 16, reducing the ratio between the number of digital detectors 16 and the number of bit lines BL available allows the MAC calculation power of the IMC device 10 to be increased without proportionally increasing its complexity, power consumption and overall cost.

In particular, this solution allows the notoriously bulky and expensive circuitry to be reused and shared, while increasing the number of memory cells 20 which, on the other hand, occupy little space and have a low cost, so as to increase the computational capabilities of the IMC device 10 without incrementing its area occupation and complexity in an equally significant manner.

The IMC device 10 allows one or more NNs to be implemented, each comprising multiple layers.

In particular, the fact that each MAC assembly 24 comprises a bit line BL for each layer of the NN and that all these bit lines BL are coupled to a same digital detector 16 through the respective selector 15 allows generating in parallel the final output data $Y_1, \ldots, Y_K$ obtained through a same layer of the NN and therefore using the layers of the NN in a sequential manner (the output of one corresponding to the input of the successive) without excessively increasing the complexity and cost of the IMC device 10.

Furthermore, the MAC circuits may have numbers different from each other of MAC assemblies 24. The MAC assemblies 24 may have numbers different from each other of bit lines BL and therefore of layers of the NN, as well as they may have numbers different from each other of sign word line groups $WL_{n+,-}$. Even inside the same MAC assembly there may be different numbers of sign word line groups $WL_{n+,-}$, as the layer considered varies. These characteristics apply, in isolation or in combination with each other, to the various embodiments of the IMC device 10 described herein.

This flexibility of use of the memory array 12 is made possible owing to the structure of the IMC device 10 and owing to the use of the address signal ADR and of the selection signals SEL, which allow the memory groups 22 to be selectively enabled/disabled in such a way as to adapt the use of the memory array 12 to the possible applications.

For example, there may be N=512 sign word line groups $WL_{n+,-}$ (i.e., 1024 word lines WL) and M=512 bit lines BL. This ensures that the IMC device 10 is capable of performing MAC operations on the basis of data and layers normally required and used.

Furthermore, the use of the memory groups 20 and the operation of the IMC device 10 with two elaboration steps for each calculation iteration allows MAC operations to be performed on the basis of signed data.

Finally, it is clear that modifications and variations may be made to the invention described and illustrated herein without thereby departing from the scope of the present invention, as defined in the attached claims. For example, the different embodiments described may be combined with each other so as to provide further solutions.

The previously described embodiments of the digital detectors 16, the timer 45, and the input-to-time converters 46 have been provided purely by way of non-limiting example, and other embodiments may similarly be considered in a per se obvious manner. For example, voltage-controlled timers, timers based on ring oscillators having an odd number of inverters, digital detectors each comprising only one integration circuit and one counter circuit, etc. may similarly be used.

Furthermore, the timer signal TM may be an analog signal and the input-to-time converters 46 may be configured to convert the respective input value $x_j$ into an analog signal and compare said analog input signal with the analog timer signal. For example, the timer signal may be a voltage ramp generated starting from a current, in particular from the reference current $I_{REF}$; in this case the update frequency of the analog timer signal is indicative of the slope of the voltage ramp.

The address signal ADR and the selection signals SEL may be different from how has been previously described. For example, they may have different codings (e.g., gray coding).

Furthermore, signed data codings different from what has been previously described may be used, in a per se evident manner.

For example, each signed datum may be stored through four respective memory cells 20 coupled to each other through two bit lines BL and two word lines WL, as better described with reference to FIG. 15. In general, this allows, with respect to the case in which each signed datum is stored through two respective memory cells 20 coupled to each other through a bit line BL and two word lines WL, the number of electrical signals generated by the control circuit 31 and managed by the IMC device 10 to be reduced.

Figure 15:
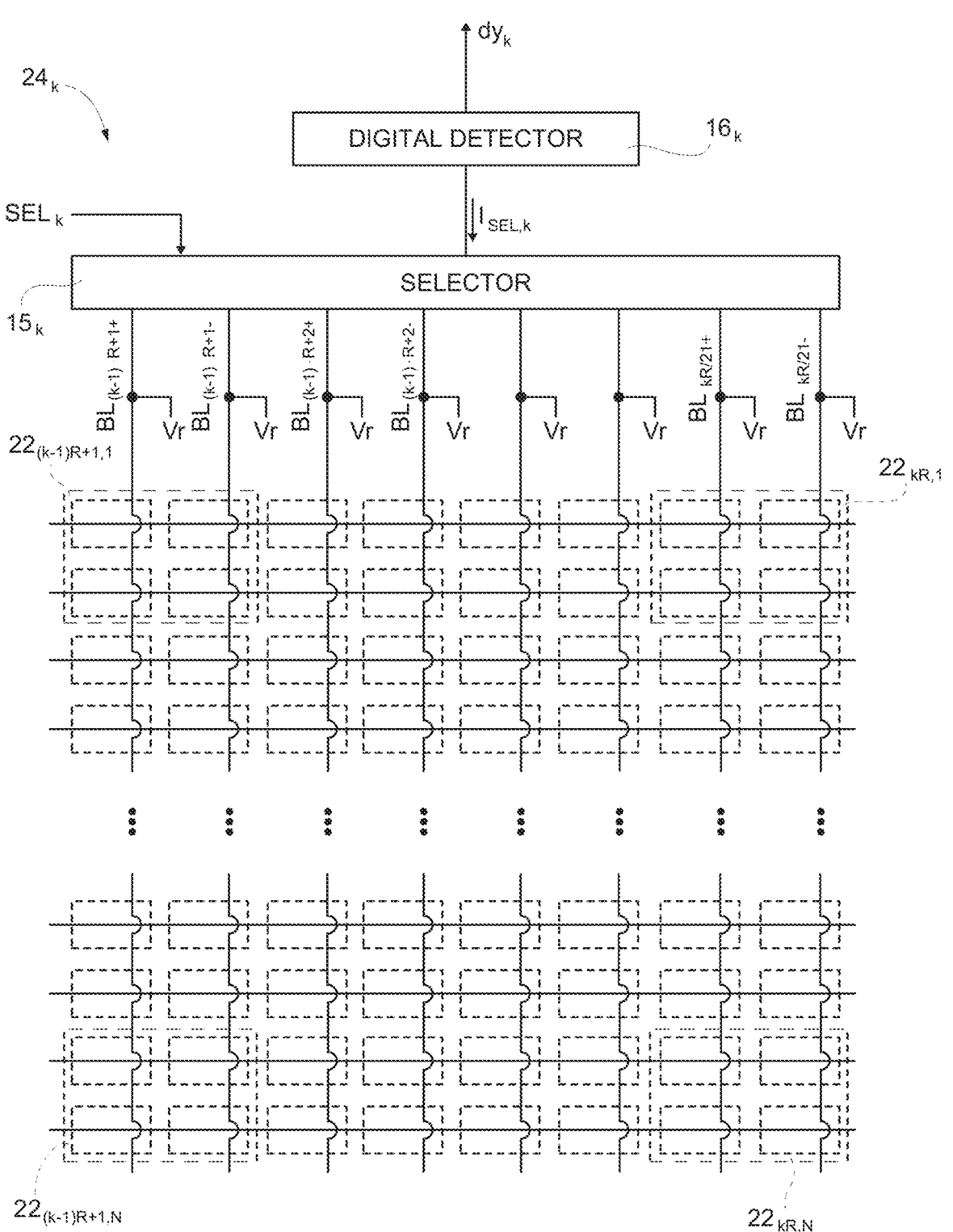

In particular, FIG. 15 shows a MAC assembly $24_k$ comprising a respective set of memory cells 20 of the memory array 12, configured to operate according to this different embodiment.

In this embodiment, the IMC device 10 is substantially similar to what has been previously described, except for the differences described hereinbelow. Consequently, the characteristics common to the previously described embodiment are not repeated herein again.

In FIG. 15, each memory group $22_{m,n}$ includes four memory cells 20 arranged in a 2×2 matrix configuration on two rows and two columns of the array 112. With this arrangement, twice as many columns are required to store the same amount of information with respect to the previous embodiment (e.g., FIGS. 1 and 12).

Although the memory cells 20 of a same group 22 are shown in FIG. 15 as placed in adjacent columns, it will be understood that this is for exemplary purposes only to facilitate the illustration; alternatively, the memory cells 20 of a same group 22 may be placed in columns which are not adjacent to each other.

Each memory group 22 stores a respective signed computational weight for an in-memory calculation operation.

In particular, a computational weight with a sign of "+1" is represented by the programming logic "1" in the memory cells 20 of the main diagonal of the 2×2 matrix (e.g., $g_{11}=1$ and $g_{22}=1$) and by the programming logic "0" in the memory cells 20 of the antidiagonal of the 2×2 matrix (e.g., $g_{12}=0$ and $g_{21}=0$) thus forming the matrix $$\begin{bmatrix} 1 & 0 \\ 0 & 1 \end{bmatrix},$$

i.e., the identity matrix; a computational weight with a sign of "−1" is represented by the programming logic "0" in the memory cells 20 of the main diagonal of the 2×2 matrix (e.g., $g_{11}=0$ and $g_{22}=0$) and by the programming logic "1" in the memory cells 20 of the antidiagonal of the 2×2 matrix (e.g., $g_{12}=1$ and $g_{21}=1$) thus forming the matrix $$\begin{bmatrix} 0 & 1 \\ 1 & 0 \end{bmatrix},$$

i.e., the exchange or inverse identity matrix; and a computational weight with a sign of "0" is represented by the programming logic "0" in the memory cells 20 of the main diagonal of the 2×2 matrix (e.g., $g_{11}=0$ and $g_{22}=0$) and by the programming logic "0" in the memory cells 20 of the antidiagonal of the 2×2 matrix (e.g., $g_{12}=0$ and $g_{21}=0$) thus forming the matrix $$\begin{bmatrix} 0 & 0 \\ 0 & 0 \end{bmatrix},$$

i.e., the null matrix.

In this manner, for each sign word line group $WL_{n+,-}$ a positive word line $WL_{n+}$ connected to the upper memory cells 20 of the memory group $22_{m,n}$ considered and a negative word line $WL_{n-}$ connected to the memory cells 20 lower than the memory group $22_{m,n}$ considered are present, and a positive bit line $BL_{m+}$ connected to the memory cells 20 on the left of the memory group $22_{m,n}$ considered and a negative bit line $BL_{m-}$ connected to the memory cells 20 on the right of the memory group $22_{m,n}$ considered are present.

Figure 16:
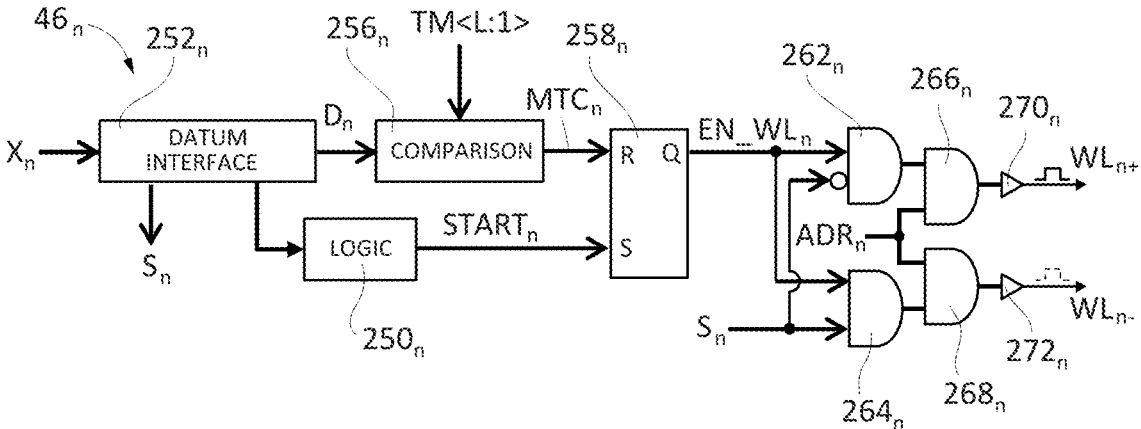

In this embodiment, the input-to-time converters 46 have the circuit structure shown in FIG. 16.

In particular, each input-to-time converter 46$n$ has a structure similar to FIGS. 5A-5C but the enable logic circuit 260$_n$ is absent and the second combinatorial logic circuit 264$_n$ receives at input the word line enable signal EN_WL$_n$ and the sign S$_n$.

In this manner, the active word line WL$_{n+}$/WL$_{n-}$ of the word line group WL$_{n+,-}$ considered is selected on the basis of the sole logic state of the sign S$_n$ of the input datum x$_n$ and not also on the basis of the elaboration signal ELAB$_n$ as previously described. In particular, if the sign S$_n$ is logic 0 (indicative of a positive input datum x$_n$), then during both elaboration steps of the calculation iteration considered the positive word line WL$_{n+}$ is selected. Conversely, if the sign S$_n$ is logic 1 (indicative of a negative input datum x$_n$), then during both elaboration steps of the calculation iteration considered the negative word line WL$_{n-}$ is selected.

Furthermore, the selection signal SEL; received by the selector 15$k$ causes the selector 15$_k$ to select the positive bit line BL$_{m+}$ during the first (positive) elaboration step of the calculation iteration considered, and the negative bit line BL$_{m-}$ during the second (negative) elaboration step of the calculation iteration considered. In this manner, the intermediate output datum dy$_k$' generated in the first elaboration step relates to the positive bit line BL$_{m+}$ and therefore to the memory cells 20 on the left of the memory group 22, while the intermediate output datum dy$_k$" generated in the second elaboration step relates to the negative bit line BL$_{m-}$ and therefore to the memory cells 20 on the right of the memory group 22.

The remaining operation of the IMC device 10 is similar to what has been previously described.

Furthermore, the memory cells 20 may be resistive memory cells not based on PCM materials, but on different technologies; for example, they may be magnetoresistive (MRAM), resistive (RRAM), or static (SRAM) memory cells.

Furthermore, the storage element 25 of each memory cell 20 may be formed by a plurality of selectable resistive elements, equal to or different from each other, mutually arranged in parallel, for example between the respective bit line and ground, which may be selectively enabled or disabled while programming the memory array 12, so that the respective transconductance value g$_{ij}$ may be a multibit value.

Furthermore, the structure of the IMC device 10 with the MAC assemblies 24 and therefore the possibility of implementing different layers of the NN, in particular in a sequential manner, is implementable in a similar manner also to the case in which the computational weights of the memory array 12 and the input data x$_1$, . . . , X$_N$ have no sign. In this case, the sign word line groups WL$_{n+,-}$ are absent and each word line activation signal 21 is generated on the basis of a respective input datum x$_n$ and is provided to a respective word line WL$_n$, with n=1, . . . , N'.

The invention claimed is:

1. An in-memory computation (IMC) device configured to receive an input signal comprising a plurality of input data and to provide at least a plurality of intermediate output data indicative of a respective final output signal which is a function of the input signal, the IMC device comprising:
   a word line activation circuit configured to receive the input signal and to provide a plurality of word line activation signals, each being a function of a respective input datum of the plurality of input data;
   a biasing circuit configured to provide a biasing voltage;
   a memory array comprising a plurality of memory cells having a matrix arrangement with a number M of columns and a number N' of rows and each coupled to a respective bit line and to a respective word line in such a way that each of the M bit lines is electrically coupled to N' respective memory cells and each of the N' word lines is electrically coupled to M respective memory cells, the bit lines being configured to each receive the biasing voltage, the memory cells being configured to each store a respective computational weight and to each receive a respective word line activation signal of the word line activation signals from the respective word line, the memory cells being configured to be traversed each by a respective cell current which is a function of the biasing voltage, the respective word line activation signal and the respective computational weight, each bit line being configured to be traversed by a respective bit line current which is a sum of the cell currents of the memory cells connected to the bit line;

a plurality K of selectors each coupled to a respective part of the bit lines and each configured to select either one or none of the respective bit lines;

a digital detector for each selector, each digital detector coupled for electrical connection through the respective selector with the respective bit line selected by the respective selector, the digital detectors being configured to sample the respective bit line currents traversing the respective bit lines to which the digital detectors are electrically coupled and, in response to the sampled bit line currents, provide the respective intermediate output data;

a first multiply and accumulate (MAC) circuit defined by the selectors, the digital detectors the bit lines coupled to the selectors and the memory cells, the first MAC circuit being configured to perform multiply and accumulate (MAC) operations relating to a first neural network defined by the computational weights of the memory cells and comprising a number R$_1$ of layers;

wherein each selector, the respective digital detector, the respective bit lines coupled to the selector and the part of memory cells arranged along the bit lines coupled to the selector form a respective multiply and accumulate (MAC) assembly of the first MAC circuit;

wherein each MAC assembly of the first MAC circuit has a respective number R$_1$ of said bit lines coupled to the respective selector, the number R$_1$ of the bit lines coupled to the respective selector being equal to the number R$_1$ of layers of the first neural network in such a way that the computational weights of the memory cells of the respective r$_1$-th bit lines of the MAC assemblies together define the respective r$_1$-th layer of the first neural network, with r$_1$=1, . . . . R$_1$ for each MAC assembly;

wherein a number L of the MAC assemblies is equal to a maximum number of final output data of the final output signal generated by the first MAC circuit; and wherein, for each layer of the first neural network, each MAC assembly is configured to generate a respective intermediate output datum of the intermediate output data, the final output data of the final output signal generated as a function of said layer of the first neural network being dependent on the respective intermediate output data generated by the MAC assemblies as a function of said layer of the first neural network.

2. The IMC device according to claim 1:

wherein each selector has a respective input for each bit line coupled to the selector, a control input, and a respective output coupled to the respective digital detector;

wherein each selector is configured to receive, through the control input, a respective control signal indicative of the inhibition of the selection of the bit lines coupled to the selector or indicative of the bit line to be selected among the bit lines coupled to the selector; and wherein each selector is configured to, as a function of the respective control signal, electrically couple the respective digital detector with the respective bit line selected or electrically decouple the respective digital detector from the respective bit lines.

3. The IMC device according to claim 1, wherein the word line activation circuit is further configured to receive an address signal indicative of the plurality of word lines, among the N' word lines, to which provide the word line activation signals, and to provide the word line activation signals to the word lines selected on the basis of the address signal.

4. The IMC device according to claim 1:

wherein the input data are in a signed format and each include a respective sign bit indicative of a sign of the input datum, and a respective plurality of value bits indicative of a value of the input datum;

wherein the memory cells along each bit line are grouped in pairs in such a way that each memory cell is part of only one of said pairs, each of said pairs of memory cells along the same bit line defining a respective memory group configured to store a respective signed computational weight;

wherein, for each memory group, the respective word line coupled to one of the memory cells of the memory group defines a positive word line and the respective word line coupled to the other of the memory cells of the memory group defines a negative word line, the positive word line and the negative word line connected to the memory group together forming a respective sign word line group;

wherein the word line activation circuit is configured to provide the word line activation signals to the sign word line groups in at least one calculation iteration comprising a respective first elaboration step and a respective second elaboration step;

wherein the word line activation circuit is configured to, in the calculation iteration:

provide, in the first elaboration step of the calculation iteration, a first plurality of said word line activation signals to the sign word line groups on the basis of the respective input data, each word line activation signal of said first plurality being provided, as a function of a respective input datum of the input data, to one of the positive word line and the negative word line of the respective sign word line group which is chosen on the basis of the sign of the respective input datum and of an elaboration signal indicative of the execution of the first elaboration step; and provide, in the second elaboration step of the calculation iteration, a second plurality of said word line activation signals to the sign word line groups on the basis of the respective input data, each word line activation signal of said second plurality being provided, as a function of the respective input datum of the input data, to the other of the positive word line and the negative word line of the respective sign word line group which is chosen on the basis of the sign of the respective input datum and of the elaboration signal indicative of the execution of the second elaboration step;

wherein, in the calculation iteration, the selectors of the first MAC circuit are each configured to select a respective $r_1$-th bit line, or none, of the respective bit lines of the MAC assemblies of the first MAC circuit;

wherein, both in the first elaboration step and in the second elaboration step of the calculation iteration, the digital detectors are configured to sample the respective bit line currents traversing the respective $r_1$-th bit lines of the MAC assemblies of the first MAC circuit to which the digital detectors are electrically coupled;

wherein the digital detectors are further configured to, in response to the bit line currents sampled in the first elaboration step of the calculation iteration, provide the respective intermediate output data of the first elaboration step and, in response to the bit line currents sampled in the second elaboration step of the calculation iteration, provide the respective intermediate output data of the second elaboration step; and wherein the final output data of the final output signal generated in the calculation iteration by the first MAC circuit as a function of the $r_1$-th layer of the first neural network are dependent on both the intermediate output data generated by the MAC assemblies of the first MAC circuit in the first elaboration step and on the intermediate output data generated by the MAC assemblies of the first MAC circuit in the second elaboration step.

5. The IMC device according to claim 4, wherein the word line activation circuit comprises a timer configured to provide a timer signal, and a plurality of input-to-time converters coupled to the timer and each to a respective sign word line group, the input-to-time converters being configured to each compare the timer signal with a respective input datum of the input data and, in response, each provide the respective activation signal to the respective sign word line group.

6. The IMC device according to claim 5, wherein each input-to-time converter comprises:

a datum interface circuit configured to receive the respective input datum and identify the sign and the value of the input datum;

a comparison circuit coupled to the datum interface circuit and configured to receive at input the value of the respective input datum and the timer signal, compare them with each other and, on the basis of this comparison, generate a corresponding match signal indicative of the fact that the timer signal is equal to, or different from, the value of the input datum;

a set-reset circuit which has a set input configured to receive the start signal indicative of a beginning of the calculation iteration, has a reset input coupled to the comparison circuit and configured to receive the match signal and has an output, the set-reset circuit being configured to, on the basis of the match signal and the start signal, generate at the output a word line enable signal which is indicative of a value of the start signal and of a value of the match signal;

an enable logic circuit coupled to the datum interface circuit and configured to receive at input the sign of the input datum and the elaboration signal and combine them to each other through exclusive OR logic;

a first combinatorial logic circuit coupled to the output of the set-reset circuit and to an output of the enable logic circuit and configured to receive at input the word line enable signal and the output of the enable logic circuit, logically combine them with each other through AND logic and generate a corresponding intermediate driver signal for the positive word line of the respective sign word line group; and a second combinatorial logic circuit coupled to the output of the set-reset circuit and, in a logically negated manner, to the output of the enable logic circuit and configured to receive at input the word line enable signal a logic inverse of the output of the enable logic circuit, logically combine them with each other through AND logic and generate a corresponding intermediate driver signal for the negative word line of the respective sign word line group.

7. The IMC device according to claim 6, wherein each input-to-time converter further comprises:

a third combinatorial logic circuit coupled to an output of the first combinatorial logic circuit and configured to receive at input the intermediate driver signal generated by the first combinatorial logic circuit and the address signal for the respective sign word line group, logically combine them with each other through AND logic and generate a driver signal for the positive word line of the sign word line group; and a fourth combinatorial logic circuit coupled to an output of the second combinatorial logic circuit and configured to receive at input the intermediate driver signal generated by the second combinatorial logic circuit and the address signal for the respective sign word line group, logically combine them with each other through AND logic and generate a respective driver signal for the negative word line of the sign word line group.

8. The IMC device according to claim 1:

wherein the input data are in a signed format and each include a respective sign bit indicative of a sign of the input datum, and a respective plurality of value bits indicative of a value of the input datum;

wherein the memory cells of each MAC assembly are grouped in groups of two respective pairs, each pair being along a respective bit line of the MAC assembly and the memory cells of the two pairs being arranged along two respective word lines of the word lines, in such a way that each memory cell is part of only one of said groups, each of said groups of memory cells defining a respective memory group configured to store a respective signed computational weight;

wherein, for each memory group, the respective word line coupled to two of the memory cells of the memory group defines a positive word line and the respective word line coupled to the other two of the memory cells of the memory group defines a negative word line, the positive word line and the negative word line connected to the memory group together forming a respective sign word line group;

wherein the word line activation circuit is configured to provide the word line activation signals to the sign word line groups in at least one calculation iteration comprising a respective first elaboration step and a respective second elaboration step;

wherein the word line activation circuit is configured to, in the calculation iteration:

provide, in the first elaboration step of the calculation iteration, a first plurality of said word line activation signals to the sign word line groups on the basis of the respective input data, each word line activation signal of said first plurality being provided, as a function of a respective input datum of the input data, to one of the positive word line and the negative word line of the respective sign word line group which is chosen on the basis of the sign of the respective input datum; and provide, in the second elaboration step of the calculation iteration, a second plurality of said word line activation signals to the sign word line groups on the basis of the respective input data, each word line activation signal of said second plurality being provided, as a function of the respective input datum of the input data, to the other of the positive word line and the negative word line of the respective sign word line group which is chosen on the basis of the sign of the respective input datum; and wherein, in the calculation iteration, the selectors of the first MAC circuit are each configured to select, in the first and the second elaboration steps, respectively an $r_1$'-th and an $r_1$"-th bit line, or none, of the respective bit lines of the MAC assemblies of the first MAC circuit, the $r_1$'-th and the $r_1$"-th bit lines being the bit lines coupled to the same memory groups which implement the $r_1$-th layer of the first neural network;

wherein, in the first elaboration step of the calculation iteration, the digital detectors are configured to sample the respective bit line currents traversing the respective $r_1$'-th bit lines of the MAC assemblies of the first MAC circuit to which the digital detectors are electrically coupled and, in the second elaboration step of the calculation iteration, the digital detectors are configured to sample the respective bit line currents traversing the respective $r_1$"-th bit lines of the MAC assemblies of the first MAC circuit to which the digital detectors are electrically coupled;

wherein the digital detectors are further configured to, in response to the bit line currents sampled in the first elaboration step of the calculation iteration, provide the respective intermediate output data of the first elaboration step and, in response to the bit line currents sampled in the second elaboration step of the calculation iteration, provide the respective intermediate output data of the second elaboration step; and wherein the final output data of the final output signal generated in the calculation iteration by the first MAC circuit as a function of the $r_1$-th layer of the first neural network are dependent on both the intermediate output data generated by the MAC assemblies of the first MAC circuit in the first elaboration step and on the intermediate output data generated by the MAC assemblies of the first MAC circuit in the second elaboration step.

9. The IMC device according to claim 8, wherein the word line activation circuit comprises a timer configured to provide a timer signal, and a plurality of input-to-time converters coupled to the timer and each to a respective sign word line group, the input-to-time converters being configured to each compare the timer signal with a respective input datum of the input data and, in response, each provide the respective activation signal to the respective sign word line group.

10. The IMC device according to claim 9, wherein each input-to-time converter comprises:

a datum interface circuit configured to receive the respective input datum and identify the sign and the value of the input datum;

a comparison circuit coupled to the datum interface circuit and configured to receive at input the value of the respective input datum and the timer signal, compare them with each other and, on the basis of this comparison, generate a corresponding match signal indicative of the fact that the timer signal is equal to, or different from, the value of the input datum;

a set-reset circuit which has a set input configured to receive the start signal indicative of the beginning of the calculation iteration, has a reset input coupled to the comparison circuit and configured to receive the match signal and has an output, the set-reset circuit being configured to, on the basis of the match signal and the start signal, generate at the output a word line enable signal which is indicative of a value of the start signal and of a value of the match signal;

a first combinatorial logic circuit coupled to the output of the set-reset circuit and, in a logically negated manner, to the datum interface circuit and configured to receive at input the word line enable signal and a logic inverse of the sign of the input datum, logically combine them to each other through AND logic and generate a corresponding intermediate driver signal for the positive word line of the respective sign word line group; and a second combinatorial logic circuit coupled to the output of the set-reset circuit and to the datum interface circuit and configured to receive at input the word line enable signal and the sign of the input datum, logically combine them with each other through AND logic and generate a corresponding intermediate driver signal for the negative word line of the respective sign word line group.

11. The IMC device according to claim 10, wherein each input-to-time converter further comprises:

a third combinatorial logic circuit coupled to an output of the first combinatorial logic circuit and configured to receive at input the intermediate driver signal generated by the first combinatorial logic circuit and the address signal for the respective sign word line group, logically combine them with each other through AND logic and generate a driver signal for the positive word line of the sign word line group; and a fourth combinatorial logic circuit coupled to an output of the second combinatorial logic circuit and configured to receive at input the intermediate driver signal generated by the second combinatorial logic circuit and the address signal for the respective sign word line group, logically combine them with each other through AND logic and generate a respective driver signal for the negative word line of the sign word line group.

12. An in-memory computation (IMC) device configured to receive an input signal comprising a plurality of input data and to provide at least a plurality of intermediate output data indicative of a respective final output signal which is a function of the input signal, the IMC device, comprising:

a word line activation circuit configured to receive the input signal and to provide a plurality of word line activation signals, each being a function of a respective input datum of the plurality of input data;

a biasing circuit configured to provide a biasing voltage;

a memory array comprising a plurality of memory cells having a matrix arrangement with a number M of columns and a number N' of rows and each coupled to a respective bit line and to a respective word line in such a way that each of the M bit lines is electrically coupled to N' respective memory cells and each of the N' word lines is electrically coupled to M respective memory cells, the bit lines being configured to each receive the biasing voltage, the memory cells being configured to each store a respective computational weight and to each receive a respective word line activation signal of the word line activation signals from the respective word line, the memory cells being configured to be traversed each by a respective cell current which is a function of the biasing voltage, the respective word line activation signal and the respective computational weight, each bit line being configured to be traversed by a respective bit line current which is a sum of the cell currents of the memory cells connected to the bit line;

a plurality K of selectors each coupled to a respective part of the bit lines and each configured to select either one or none of the respective bit lines;

a digital detector for each selector, each digital detector coupled for electrical connection through the respective selector with the respective bit line selected by the respective selector, the digital detectors being configured to sample the respective bit line currents traversing the respective bit lines to which the digital detectors are electrically coupled and, in response to the sampled bit line currents, provide the respective intermediate output data;

a first multiply and accumulate (MAC) circuit defined by a first part of the selectors, the respective digital detectors, the bit lines coupled to the first part of the selectors and the memory cells along the bit lines coupled to the first part of the selectors, the first MAC circuit being configured to perform multiply and accumulate (MAC) operations relating to a first neural network defined by the computational weights of the memory cells along the bit lines coupled to the first part of the selectors and comprising a number $R_1$ of layers; and at least a second multiply and accumulate (MAC) circuit defined by a second part of the selectors, the respective digital detectors, the bit lines coupled to the second part of the selectors and the memory cells along the bit lines coupled to the second part of the selectors, the at least one second MAC circuit being configured to perform multiply and accumulate (MAC) operations relating to at least one second neural network defined by the computational weights of the memory cells along the bit lines coupled to the second part of the selectors and comprising a number $R_2$ of layers;

wherein each selector, the respective digital detector, the respective bit lines coupled to the selector and the part of memory cells arranged along the bit lines coupled to the selector form a respective multiply and accumulate (MAC) assembly of the first MAC circuit or of the at least one second MAC circuit;

wherein each MAC assembly of the first MAC circuit has a respective number $R_1$ of said bit lines coupled to the respective selector, the number $R_1$ of the bit lines coupled to the respective selector being equal to the number $R_1$ of layers of the first neural network in such a way that the computational weights of the memory cells of the respective $r_1$-th bit lines of the MAC assemblies of the first MAC circuit together define the respective $r_1$-th layer of the first neural network, with $r_1=1, \ldots, R_1$ for each MAC assembly of the first MAC circuit;

wherein each MAC assembly of the at least one second MAC circuit has a respective number $R_2$ of said bit lines coupled to the respective selector, the number $R_2$ of the bit lines coupled to the respective selector being equal to the number $R_2$ of layers of the second neural network in such a way that the computational weights of the memory cells of the respective $r_2$-th bit lines of the MAC assemblies of the at least one second MAC circuit together define the respective $r_2$-th layer of the second neural network, with $r_2=1, \ldots, R_2$ for each MAC assembly of the at least one second MAC circuit;

wherein a number K of MAC assemblies is equal to, or greater than, the greater of a maximum number of final output data of the final output signal generated by the first MAC circuit and a maximum number of final output data of the final output signal generated by the at least one second MAC circuit;

wherein, for each layer of the first neural network, each MAC assembly of the first MAC circuit is configured to generate a respective intermediate output datum of the intermediate output data, the final output data of the final output signal generated by the first MAC circuit as a function of said layer of the first neural network being dependent on the respective intermediate output data generated by the MAC assemblies of the first MAC circuit as a function of said layer of the first neural network; and wherein, for each layer of the at least one second neural network, each MAC assembly of the at least one second MAC circuit is configured to generate a respective intermediate output datum of the intermediate output data, the final output data of the final output signal generated by the at least one second MAC circuit as a function of said layer of the at least one second neural network being dependent on the respective intermediate output data generated by the MAC assemblies of the at least one second MAC circuit as a function of said layer of the at least one second neural network.

13. The IMC device according to claim 12:

wherein the input data are in a signed format and each include a respective sign bit indicative of a sign of the input datum, and a respective plurality of value bits indicative of a value of the input datum;

wherein the memory cells along each bit line are grouped in pairs in such a way that each memory cell is part of only one of said pairs, each of said pairs of memory cells along the same bit line defining a respective memory group configured to store a respective signed computational weight;

wherein, for each memory group, the respective word line coupled to one of the memory cells of the memory group defines a positive word line and the respective word line coupled to the other of the memory cells of the memory group defines a negative word line, the positive word line and the negative word line connected to the memory group together forming a respective sign word line group;

wherein the word line activation circuit is configured to provide the word line activation signals to the sign word line groups in at least one calculation iteration comprising a respective first elaboration step and a respective second elaboration step;

wherein the word line activation circuit is configured to, in the calculation iteration:

provide, in the first elaboration step of the calculation iteration, a first plurality of said word line activation signals to the sign word line groups on the basis of the respective input data, each word line activation signal of said first plurality being provided, as a function of a respective input datum of the input data, to one of the positive word line and the negative word line of the respective sign word line group which is chosen on the basis of the sign of the respective input datum and of an elaboration signal indicative of the execution of the first elaboration step; and provide, in the second elaboration step of the calculation iteration, a second plurality of said word line activation signals to the sign word line groups on the basis of the respective input data, each word line activation signal of said second plurality being provided, as a function of the respective input datum of the input data, to the other of the positive word line and the negative word line of the respective sign word line group which is chosen on the basis of the sign of the respective input datum and of the elaboration signal indicative of the execution of the second elaboration step;

wherein, in the calculation iteration, the selectors of the first MAC circuit are each configured to select a respective $r_1$-th bit line, or none, of the respective bit lines of the MAC assemblies of the first MAC circuit;

wherein, both in the first elaboration step and in the second elaboration step of the calculation iteration, the digital detectors are configured to sample the respective bit line currents traversing the respective $r_1$-th bit lines of the MAC assemblies of the first MAC circuit to which the digital detectors are electrically coupled;

wherein the digital detectors are further configured to, in response to the bit line currents sampled in the first elaboration step of the calculation iteration, provide the respective intermediate output data of the first elaboration step and, in response to the bit line currents sampled in the second elaboration step of the calculation iteration, provide the respective intermediate output data of the second elaboration step; and wherein the final output data of the final output signal generated in the calculation iteration by the first MAC circuit as a function of the $r_1$-th layer of the first neural network are dependent on both the intermediate output data generated by the MAC assemblies of the first MAC circuit in the first elaboration step and on the intermediate output data generated by the MAC assemblies of the first MAC circuit in the second elaboration step.

14. The IMC device according to claim 13, wherein the word line activation circuit comprises a timer configured to provide a timer signal, and a plurality of input-to-time converters coupled to the timer and each to a respective sign word line group, the input-to-time converters being configured to each compare the timer signal with a respective input datum ($Xn$) of the input data and, in response, each provide the respective activation signal to the respective sign word line group.

15. The IMC device according to claim 14, wherein each input-to-time converter comprises:

a datum interface circuit configured to receive the respective input datum and identify the sign and the value of the input datum;

a comparison circuit coupled to the datum interface circuit and configured to receive at input the value of the respective input datum and the timer signal, compare them with each other and, on the basis of this comparison, generate a corresponding match signal indicative of the fact that the timer signal is equal to, or different from, the value of the input datum;

a set-reset circuit which has a set input configured to receive the start signal indicative of a beginning of the calculation iteration, has a reset input coupled to the comparison circuit and configured to receive the match signal and has an output, the set-reset circuit being configured to, on the basis of the match signal and the start signal, generate at the output a word line enable signal which is indicative of a value of the start signal and of a value of the match signal;

an enable logic circuit coupled to the datum interface circuit and configured to receive at input the sign of the input datum and the elaboration signal and combine them to each other through exclusive OR logic;

a first combinatorial logic circuit coupled to the output of the set-reset circuit and to an output of the enable logic circuit and configured to receive at input the word line enable signal and the output of the enable logic circuit, logically combine them with each other through AND logic and generate a corresponding intermediate driver signal for the positive word line of the respective sign word line group; and a second combinatorial logic circuit coupled to the output of the set-reset circuit and, in a logically negated manner, to the output of the enable logic circuit and configured to receive at input the word line enable signal a logic inverse of the output of the enable logic circuit, logically combine them with each other through AND logic and generate a corresponding intermediate driver signal for the negative word line of the respective sign word line group.

16. The IMC device according to claim 15, wherein each input-to-time converter further comprises:

a third combinatorial logic circuit coupled to an output of the first combinatorial logic circuit and configured to receive at input the intermediate driver signal generated by the first combinatorial logic circuit and the address signal for the respective sign word line group, logically combine them with each other through AND logic and generate a driver signal for the positive word line of the sign word line group; and a fourth combinatorial logic circuit coupled to an output of the second combinatorial logic circuit and configured to receive at input the intermediate driver signal generated by the second combinatorial logic circuit and the address signal for the respective sign word line group, logically combine them with each other through AND logic and generate a respective driver signal for the negative word line of the sign word line group.

17. The IMC device according to claim 12:

wherein the input data are in a signed format and each include a respective sign bit indicative of a sign of the input datum, and a respective plurality of value bits indicative of a value of the input datum;

wherein the memory cells of each MAC assembly are grouped in groups of two respective pairs, each pair being along a respective bit line of the MAC assembly and the memory cells of the two pairs being arranged along two respective word lines of the word lines, in such a way that each memory cell is part of only one of said groups, each of said groups of memory cells defining a respective memory group configured to store a respective signed computational weight;

wherein, for each memory group, the respective word line coupled to two of the memory cells of the memory group defines a positive word line and the respective word line coupled to the other two of the memory cells of the memory group defines a negative word line, the positive word line and the negative word line connected to the memory group together forming a respective sign word line group;

wherein the word line activation circuit is configured to provide the word line activation signals to the sign word line groups in at least one calculation iteration comprising a respective first elaboration step and a respective second elaboration step;

wherein the word line activation circuit is configured to, in the calculation iteration:

provide, in the first elaboration step of the calculation iteration, a first plurality of said word line activation signals to the sign word line groups on the basis of the respective input data, each word line activation signal of said first plurality being provided, as a function of a respective input datum of the input data, to one of the positive word line and the negative word line of the respective sign word line group which is chosen on the basis of the sign of the respective input datum; and provide, in the second elaboration step of the calculation iteration, a second plurality of said word line activation signals to the sign word line groups on the basis of the respective input data, each word line activation signal of said second plurality being provided, as a function of the respective input datum of the input data, to the other of the positive word line and the negative word line of the respective sign word line group which is chosen on the basis of the sign of the respective input datum; and wherein, in the calculation iteration, the selectors of the first MAC circuit are each configured to select, in the first and the second elaboration steps, respectively an $r_1'$-th and an $r_1''$-th bit line, or none, of the respective bit lines of the MAC assemblies of the first MAC circuit, the $r_1'$-th and the $r_1''$-th bit lines being the bit lines coupled to the same memory groups which implement the $r_1$-th layer of the first neural network;

wherein, in the first elaboration step of the calculation iteration, the digital detectors are configured to sample the respective bit line currents traversing the respective $r_1'$-th bit lines of the MAC assemblies of the first MAC circuit to which the digital detectors are electrically coupled and, in the second elaboration step of the calculation iteration, the digital detectors are configured to sample the respective bit line currents traversing the respective $r_1''$-th bit lines of the MAC assemblies of the first MAC circuit to which the digital detectors are electrically coupled;

wherein the digital detectors are further configured to, in response to the bit line currents sampled in the first elaboration step of the calculation iteration, provide the respective intermediate output data of the first elaboration step and, in response to the bit line currents sampled in the second elaboration step of the calculation iteration, provide the respective intermediate output data of the second elaboration step; and wherein the final output data of the final output signal generated in the calculation iteration by the first MAC circuit as a function of the $r_1$-th layer of the first neural network are dependent on both the intermediate output data generated by the MAC assemblies of the first MAC circuit in the first elaboration step and on the intermediate output data generated by the MAC assemblies of the first MAC circuit in the second elaboration step.

18. The IMC device according to claim 17, wherein the word line activation circuit comprises a timer configured to provide a timer signal, and a plurality of input-to-time converters coupled to the timer and each to a respective sign word line group, the input-to-time converters being configured to each compare the timer signal with a respective input datum of the input data and, in response, each provide the respective activation signal to the respective sign word line group.

19. The IMC device according to claim 18, wherein each input-to-time converter comprises:

a datum interface circuit configured to receive the respective input datum and identify the sign and the value of the input datum;

a comparison circuit coupled to the datum interface circuit and configured to receive at input the value of the respective input datum and the timer signal, compare them with each other and, on the basis of this comparison, generate a corresponding match signal indicative of the fact that the timer signal is equal to, or different from, the value of the input datum;

a set-reset circuit which has a set input configured to receive the start signal indicative of the beginning of the calculation iteration, has a reset input coupled to the comparison circuit and configured to receive the match signal and has an output, the set-reset circuit being configured to, on the basis of the match signal and the start signal, generate at the output a word line enable signal which is indicative of a value of the start signal and of a value of the match signal;

a first combinatorial logic circuit coupled to the output of the set-reset circuit and, in a logically negated manner, to the datum interface circuit and configured to receive at input the word line enable signal and a logic inverse of the sign of the input datum, logically combine them to each other through AND logic and generate a corresponding intermediate driver signal for the positive word line of the respective sign word line group; and a second combinatorial logic circuit coupled to the output of the set-reset circuit and to the datum interface circuit and configured to receive at input the word line enable signal and the sign of the input datum, logically combine them with each other through AND logic and generate a corresponding intermediate driver signal for the negative word line of the respective sign word line group.

20. The IMC device according to claim 19, wherein each input-to-time converter further comprises:

a third combinatorial logic circuit coupled to an output of the first combinatorial logic circuit and configured to receive at input the intermediate driver signal generated by the first combinatorial logic circuit and the address signal for the respective sign word line group, logically combine them with each other through AND logic and generate a driver signal for the positive word line of the sign word line group; and a fourth combinatorial logic circuit coupled to an output of the second combinatorial logic circuit and configured to receive at input the intermediate driver signal generated by the second combinatorial logic circuit and the address signal for the respective sign word line group, logically combine them with each other through AND logic and generate a respective driver signal for the negative word line of the sign word line group.

21. The IMC device according to claim 1, further comprising a control circuit operatively coupled to the word line activation circuit, the selectors and the digital detectors and configured to control the word line activation circuit and the selectors, receive the intermediate output data from the digital detectors and generate the final output signal on the basis of the intermediate output data.

22. The IMC device according to claim 1, wherein the memory cells are non-volatile memory cells, and wherein the memory cells each have a current path comprising a storage element and a selection element and extending between a common node and a reference potential node, the selection element being configured to selectively close the respective current path, as a function of the respective activation signal.

23. The IMC device according to claim 1, further comprising:

wherein the biasing applies the biasing voltage to the bit lines;

control circuitry configured to:

control the word line activation circuit to provide the plurality of activation signals to the memory cells, each activation signal being a function of a respective input value;

control the selectors to select one or none of the respective bit lines; and control the digital detectors to sample the respective bit line currents traversing the respective bit lines to which the digital detectors are electrically coupled and, in response to the sampled bit line currents, providing the respective intermediate output data.

24. The IMC device according to claim 12:

wherein each selector has a respective input for each bit line coupled to the selector, a control input, and a respective output coupled to the respective digital detector;

wherein each selector is configured to receive, through the control input, a respective control signal indicative of the inhibition of the selection of the bit lines coupled to the selector or indicative of the bit line to be selected among the bit lines coupled to the selector; and wherein each selector is configured to, as a function of the respective control signal, electrically couple the respective digital detector with the respective bit line selected or electrically decouple the respective digital detector from the respective bit lines.

25. The IMC device according to claim 12, wherein the word line activation circuit is further configured to receive an address signal indicative of the plurality of word lines, among the N' word lines, to which provide the word line activation signals, and to provide the word line activation signals to the word lines selected on the basis of the address signal.

26. The IMC device according to claim 12, further comprising a control circuit operatively coupled to the word line activation circuit, the selectors and the digital detectors and configured to control the word line activation circuit and the selectors, receive the intermediate output data from the digital detectors and generate the final output signal on the basis of the intermediate output data.

27. The IMC device according to claim 12, wherein the memory cells are non-volatile memory cells, and wherein the memory cells each have a current path comprising a storage element and a selection element and extending between a common node and a reference potential node, the selection element being configured to selectively close the respective current path, as a function of the respective activation signal.

28. The IMC device according to claim 12, further comprising:

wherein the bias circuit applies the biasing voltage to the bit lines;

control circuitry configured to:

control the word line activation circuit to provide the plurality of activation signals to the memory cells, each activation signal being a function of a respective input value;

control the selectors to select one or none of the respective bit lines; and control the digital detectors to sample the respective bit line currents traversing the respective bit lines to which the digital detectors are electrically coupled and, in response to the sampled bit line currents, providing the respective intermediate output data.

\* \* \* \* \*